(12) United States Patent
Gong et al.

(10) Patent No.: US 8,222,077 B2
(45) Date of Patent: Jul. 17, 2012

(54) METAL-INSULATOR-METAL (MIM) DEVICES AND THEIR METHODS OF FABRICATION

(75) Inventors: Xiong Gong, Goleta, CA (US); Kaixia Yang, Chang Chun (CN); Gang Yu, Santa Barbara, CA (US); Boo Jorgen Lars Nilsson, Goleta, CA (US); Chan-Long Shieh, Paradise Valley, AZ (US); Hsing-Chung Lee, Calabases, CA (US); Fatt Foong, Goleta, CA (US)

(73) Assignee: Cbrite Inc., Goleta, CA (US)

( * ) Notice: Subject to any disclaimer, the term of this patent is extended or adjusted under 35 U.S.C. 154(b) by 973 days.

(21) Appl. No.: 11/983,205

(22) Filed: Nov. 6, 2007

(65) Prior Publication Data
US 2008/0169464 A1    Jul. 17, 2008

Related U.S. Application Data

(60) Provisional application No. 60/857,750, filed on Nov. 7, 2006.

(51) Int. Cl.
*H01L 21/28* (2006.01)
(52) U.S. Cl. ............. 438/104; 438/957; 257/30; 257/43
(58) Field of Classification Search .................. 438/104, 438/957
See application file for complete search history.

(56) References Cited

U.S. PATENT DOCUMENTS

| | | |
|---|---|---|
| 4,042,293 A | 8/1977 | Hanak et al. |
| 4,105,513 A | 8/1978 | Nishino et al. |
| 4,223,308 A | 9/1980 | Baraff et al. |
| 4,251,136 A | 2/1981 | Miner et al. |
| 4,715,685 A | 12/1987 | Yaniv et al. |
| 4,864,472 A | 9/1989 | Yoshimura et al. |
| 4,952,984 A | 8/1990 | Kuijk et al. |
| 5,117,298 A | 5/1992 | Hirai |
| 5,122,889 A | 6/1992 | Kaneko |
| 5,189,136 A | 2/1993 | Wudl et al. |
| 5,357,357 A | 10/1994 | Imazeki et al. |
| 5,455,736 A | 10/1995 | Nishiyama et al. |
| 5,464,990 A | 11/1995 | Yamaguchi et al. |
| 5,483,263 A | 1/1996 | Bird et al. |

(Continued)

FOREIGN PATENT DOCUMENTS

CN    1383168 A    12/2002
(Continued)

OTHER PUBLICATIONS

First Office Action for Application No. EP04703079.6, dated Feb. 2, 2010.
(Continued)

*Primary Examiner* — Jerome Jackson, Jr.
(74) *Attorney, Agent, or Firm* — Weaver Austin Villeneuve & Sampson LLP

(57) ABSTRACT

Two-terminal switching devices of MIM type having at least one electrode formed by a liquid phase processing method are provided for use in active matrix backplane applications; more specifically, MIM devices with symmetric current-voltage characteristics are applied for LCD active matrix backplane applications, and MIM devices with asymmetric current-voltage characteristics are applied for active matrix backplane implementation for electrophoretic displays (EPD) and rotating element displays. In particular, the combination of the bottom metal, metal-oxide insulator and solution-processible top conducting layer enables high throughput, roll-to-roll process for flexible displays.

44 Claims, 18 Drawing Sheets

U.S. PATENT DOCUMENTS

| | | | |
|---|---|---|---|
| 5,485,294 | A | 1/1996 | Sugiyama et al. |
| 5,926,236 | A | 7/1999 | Den Boer et al. |
| 6,008,872 | A | 12/1999 | Den Boer et al. |
| 6,017,259 | A * | 1/2000 | Motoi et al. ............... 445/51 |
| 6,087,196 | A | 7/2000 | Sturm et al. |
| 6,177,921 | B1 | 1/2001 | Comiskey et al. |
| 6,372,154 | B1 | 4/2002 | Li |
| 6,380,922 | B1 | 4/2002 | Hewes et al. |
| 6,437,769 | B1 | 8/2002 | Kobayashi |
| 6,441,395 | B1 | 8/2002 | Yu et al. |
| 6,506,438 | B2 | 1/2003 | Duthaler et al. |
| 6,512,172 | B1 * | 1/2003 | Salafsky et al. ............... 136/263 |
| 6,582,504 | B1 | 6/2003 | Fujita |
| 6,623,903 | B2 | 9/2003 | Lamotte |
| 6,707,060 | B2 | 3/2004 | Yu et al. |
| 6,734,460 | B2 | 5/2004 | Okumura et al. |
| 6,852,555 | B1 | 2/2005 | Roman et al. |
| 6,864,111 | B2 | 3/2005 | Yu et al. |
| 6,881,115 | B2 * | 4/2005 | Yamamoto et al. ............ 445/24 |
| 6,891,237 | B1 | 5/2005 | Bao et al. |
| 6,958,251 | B2 | 10/2005 | Yamazaki |
| 7,030,412 | B1 | 4/2006 | Drzaic et al. |
| 7,161,797 | B2 | 1/2007 | Vaisman et al. |
| 7,405,775 | B2 | 7/2008 | Nilsson |
| 7,491,575 | B2 * | 2/2009 | Wu et al. ............... 438/104 |
| 7,528,896 | B2 | 5/2009 | Nilsson |
| 7,898,042 | B2 | 3/2011 | Yu et al. |
| 2002/0027636 | A1 | 3/2002 | Yamada |
| 2002/0053320 | A1 | 5/2002 | Duthaler et al. |
| 2002/0080637 | A1 | 6/2002 | Yi et al. |
| 2002/0106847 | A1 | 8/2002 | Kazlas et al. |
| 2002/0119584 | A1 | 8/2002 | Duthaler et al. |
| 2002/0127821 | A1 | 9/2002 | Ohya et al. |
| 2002/0179901 | A1 | 12/2002 | Arai et al. |
| 2004/0056180 | A1 | 3/2004 | Yu |
| 2004/0135518 | A1 * | 7/2004 | Brune et al. ............... 315/167 |
| 2004/0179146 | A1 | 9/2004 | Nilsson |
| 2005/0105010 | A1 | 5/2005 | Oh |
| 2005/0154119 | A1 | 7/2005 | Robeson et al. |
| 2005/0224788 | A1 | 10/2005 | Hsu et al. |
| 2005/0227081 | A1 | 10/2005 | Hsu et al. |
| 2006/0027804 | A1 | 2/2006 | Yamazaki et al. |
| 2006/0061716 | A1 | 3/2006 | Yamaguchi |
| 2006/0076557 | A1 | 4/2006 | Waller et al. |
| 2006/0091397 | A1 | 5/2006 | Akimoto et al. |
| 2006/0092343 | A1 | 5/2006 | Nilsson |
| 2006/0145597 | A1 | 7/2006 | Brabec |
| 2008/0105870 | A1 | 5/2008 | Yu et al. |
| 2008/0138920 | A1 | 6/2008 | Nilsson |
| 2008/0169464 | A1 | 7/2008 | Gong et al. |
| 2009/0085095 | A1 * | 4/2009 | Kamath et al. ............... 257/321 |
| 2009/0224236 | A1 | 9/2009 | Nilsson |
| 2011/0147761 | A1 | 6/2011 | Yu et al. |

FOREIGN PATENT DOCUMENTS

| | | |
|---|---|---|
| CN | 1739205 A | 2/2006 |
| EP | 1 251 720 | 10/2002 |
| JP | 61-089663 | 5/1986 |
| JP | 62-138834 | 6/1987 |
| JP | 64-052128 | 2/1989 |
| JP | 01-109328 | 4/1989 |
| JP | 01-125861 | 5/1989 |
| JP | 02-000831 | 1/1990 |
| JP | 03-126275 | 5/1991 |
| JP | 04-093078 | 3/1992 |
| JP | 05-080356 | 4/1993 |
| JP | 99/39394 | 8/1999 |
| JP | 2004/071682 | 3/2004 |
| WO | 2004-093078 | 3/1992 |
| WO | 96/19837 | 6/1996 |
| WO | WO 99/39394 | 8/1999 |
| WO | WO 00 65653 | 11/2000 |
| WO | WO 2004/051750 | 6/2004 |
| WO | WO 04/066410 | 8/2004 |
| WO | WO 2004/114008 | 12/2004 |
| WO | WO 2005/090434 | 9/2005 |
| WO | WO 2008/057553 | 5/2008 |
| WO | WO 2008/057560 | 5/2008 |

OTHER PUBLICATIONS

Fourth Office Action for Application No. CN200480002330.9, dated Jan. 8, 2010.
Office Action for Chinese Patent Application 2004-80002330.9 mailed Jul. 17, 2009.
U.S. Appl. No. 11/801,735, mailed Sep. 4, 2009.
Notice of Allowance mailed Nov. 30, 2007 for U.S. Appl. No. 10/759,807 filed on Jan. 16, 2004.
Baytron® for Solid Electrolyte Capacitors, downloaded on Nov. 7, 2007, from http://www.baytron.com/index.php?page_id=971.
Final Office Action mailed May 1, 2008 for U.S. Appl. No. 11/298,098.
Birnstock et al., "Screen-printed Passive Matrix Displays Based on Light-emitting Polymers" Applied Physics Letters, American Institute of Physics. New York, US, vol. 78, No. 24, Jun. 11, 2001, pp. 3905-3907, XP001077323 ISSN: 003-6951 abstract.
Patent Abstracts of Japan vol. 016, No. 084 (E-1172), Feb. 28, 1992 & JP 03269995 A (Ricoh Co Ltd.), Dec. 2, 1991 abstract.
U.S. Office Action dated Sep. 21, 2005 in related U.S. Appl. No. 10/759,807.
U.S. Office Action dated Sep. 20, 2006 in related U.S. Appl. No. 10/759,807.
U.S. Office Action dated Apr. 5, 2007 in related U.S. Appl. No. 11/298,098.
U.S. Office Action dated Apr. 19, 2007 in related U.S. Appl. No. 10/759,807.
H.-C. Lee et al., U.S. Appl. No. 11/430,075, filed on May 8, 2006.
C.-L. Shieh et al., U.S. Appl. No. 11/650,148, filed on Jan. 5, 2007.
Kamiyama, S.; Saeki, T.; Mori, H.; Numasawa, Y. Electron Devices Meeting, 1991. Technical Digest., International Volume Issue, Dec. 8-11, 1991 pp. 827-830.
International Search Report and Written Opinion, mailed May 29, 2008 for PCT/US2007/023441.
International Search Report and Written Opinion, mailed May 29, 2008 for PCT/US2007/023427.
Chinese Office Action for 200480002330.9 mailed Dec. 26, 2008.
U.S. Office Action for U.S. Appl. No. 12/009,386 mailed Jul. 8, 2008.
Notice of Allowance for U.S. Appl. No. 12/009,386 mailed Feb. 10, 2009.
First Office Action for Application No. 2006-501075, dated Mar. 12, 2010.
U.S. Final Office Action mailed Mar. 30, 2010 for U.S. Appl. No. 11/801,735.
U.S. Notice of Allowance mailed May 25, 2010 and Allowed Claims for U.S. Appl. No. 11/801,735.
U.S. Notice of Allowance mailed Nov. 3, 2010 and Allowed Claims for U.S. Appl. No. 11/801,735.
First Office Action for Application No. 200780049295.X dated Dec. 14, 2010.
First Office Action for Application No. 200780049394.8 dated Aug. 4, 2010.
2nd Office Action for Application No. 2006-501075, dated Dec. 14, 2010.
2nd Office Action for Applciation No. 04 703 079.6 dated Mar. 9, 2011.
U.S. Office Action dated Jun. 28, 2011 issued in in U.S. Appl. No. 12/411,210.
U.S. Notice of Allowance dated Aug. 22, 2011 issued in U.S. Appl. No. 13/015,013.
PCT International Search Report dated Jul. 20, 2004 issued in PCT/US2004/001557.
PCT International Preliminary Report on Patentability and Written Opinion dated Jul. 22, 2005 issued in PCT/US2004/001557.
CN First Office Action dated Jul. 11, 2008 issued in CN 200480002330.9.
JP First Office Action dated Jan. 12, 2010 issued in JP 2006-501075.
PCT International Preliminary Report on Patentability and Written Opinion dated May 12, 2009 issued in PCT/US2007/023427.

Patent Abstracts of Japan vol. 0153, No. 34 (E-11 04), Aug. 26, 1991 & JP 03, 126275, A, (Seiko Epson Corp), May 29, 1991.
Patent Abstracts of Japan vol. 0133, No. 71 (E-807), Aug. 17, 1989 & JP 01, 125861, A, (Japan Synthetic Rubber Co Ltd), May 18, 1989.
U.S. Final Office Action dated Feb. 7, 2012 issued in in U.S. Appl. No. 12/411,210.

U.S. Notice of Allowance, Notice of Allowability and Allowed Claims dated Feb. 3, 2012 issued in U.S. Appl. No. 13/015,013.
PCT International Preliminary Report on Patentability and Written Opinion dated May 12, 2009 issued in PCT/US2007/023441.

* cited by examiner

METAL-INSULATOR-METAL (MIM) DEVICES AND THEIR METHODS OF FABRICATION

CROSS-REFERENCE TO RELATED APPLICATIONS

This application claims benefit of U.S. Provisional Application No. 60/857,750 filed Nov. 7, 2006, titled "Metal-insulator-metal (MIM) devices and their methods of fabrication" which is herein incorporated by reference for all purposes. This application is related to the following US patent applications, each of which is incorporated herein by reference for all purposes: (1) U.S. Provisional Application No. 60/440,709 filed Jan. 17, 2003; (2) U.S. patent application Ser. No. 10/759,807 filed Jan. 16, 2004, titled "Display Employing Organic Material" naming Boo Jorgen Lars Nilsson as an inventor, which claims benefit of prior U.S. Provisional Application No. 60/440,709 filed Jan. 17, 2003, (3) U.S. patent application Ser. No. 11/298,098 filed Dec. 8, 2005, which is a divisional of U.S. patent application Ser. No. 10/759,807, and (4) U.S. application Ser. No. 11/801,735 filed May 09, 2007, titled "Two-terminal switching devices and their methods of fabrication".

FIELD OF THE INVENTION

The invention relates to two-terminal switching devices, such as MIM diodes, for use in the backplanes of various types of displays, including liquid crystal displays, electrophoretic displays, and rotating element displays.

BACKGROUND OF THE INVENTION

Active matrix displays employ a switch at each picture element in a matrix display so that the voltage across each pixel can be controlled independently. Active matrices are especially suitable for high information content Liquid Crystal Displays (LCDs) such as LCDs used in second-generation PDAs and cell phones.

Other types of displays that typically require a switching device at each picture element include Electrophoretic Displays (EFDs) and rotating element displays. Electrophoretic displays, including displays available from companies such as E-Ink and Sipix, produce an image relying on translational movement of charged colored particles suspended in a liquid of a different color. Rotating element displays use rotational movement of optically and electrically anisotropic elements, such as bichromal spheres having a non-uniform charge distribution. Pixel performance of electrophoretic and rotating element displays can be controlled with a switching device that provides on- and off- voltages to each of the picture elements in the display matrix.

Switching devices that have been proposed for active matrix display applications include various types of Thin Film Transistors (TFTs) and Thin Film Diodes (TFDs) such as Metal Insulator Metal (MIM) diodes. MIM diodes are particularly appealing since their structure is relatively simple and they are typically easier to fabricate than TFTs.

MIM diodes are broadly defined as switching devices that include a layer of an insulating or semiconducting material residing between two layers of conductive material (not necessarily metal). Often MIM devices do not include any other layers beyond these three layers; however this is not necessarily the case. Regardless of the specific structure, fabrication of MIM devices at particular levels of miniaturization can be still a laborious and expensive process. Typically, MIM devices are fabricated using techniques employed in integrated circuit industry requiring costly equipment and laborious processing.

SUMMARY

The present invention addresses these problems by providing inexpensive and efficient fabrication methods for two-terminal switching devices. Device structures having advantageous switching characteristics are also provided. The provided devices can be used as switches for active-matrix displays, such as active matrix LCD displays, electrophoretic displays, rotating element displays, and other types of electro-optic displays.

According to one aspect, a two terminal switching device is provided. In one embodiment, the two terminal switching device includes a first electrode formed on a substrate, a layer of an inorganic insulating or broad-band semiconducting material, and a second electrode. The first and second electrodes include layers of first and second conductive materials respectively, which are selected such that at least one layer of conductive material is formed onto the partially fabricated switching device by a liquid-phase processing method. According to some embodiments the second (e.g., top) electrode layer includes a conductive material deposited by a liquid phase method such as printing.

In some embodiments two-terminal devices with a symmetrical current-voltage characteristic are provided. The device may include a first electrode formed on a substrate, wherein the first electrode comprises a layer of first conductive material, wherein the first conductive material is characterized by a first work function value; a layer of an inorganic insulating or broad band semiconducting material; and a second electrode comprising a layer of a second conductive material wherein the second conductive material is characterized by a second work function value. In a symmetrical device the work function difference between the first conductive material and the second conductive material is typically less than about 100 meV. The device is built such that at least a portion of the inorganic layer resides between the first and second electrodes, and at least one of the first and second electrodes is formed onto the partially fabricated switching device by a liquid-phase processing method.

In some embodiments two-terminal devices with an asymmetrical current-voltage characteristic are provided. The device may include a first electrode formed on a substrate, wherein the first electrode comprises a layer of first conductive material, wherein the first conductive material is characterized by a first work function value; a layer of an inorganic insulating or broad band semiconducting material; and a second electrode comprising a layer of a second conductive material wherein the second conductive material is characterized by a second work function value. In an asymmetrical device the work function difference between the first conductive material and the second conductive material is typically at least about 100 meV. The device is built such that at least a portion of the inorganic layer resides between the first and second electrodes, and at least one of the first and second electrodes is formed onto the partially fabricated switching device by a liquid-phase processing method.

Fabrication of electrodes by a liquid-phase processing method reduces or eliminates the need for costly photolithographic patterning, and allows for efficient device fabrication.

According to another aspect, a method of forming a two-terminal switching device is provided. The method involves forming a first electrode of the two-terminal switching device on a substrate, wherein the first electrode comprises a layer of a first conductive material, the first conductive material being characterized by a first work function value; forming a layer of an inorganic insulator or broad band semiconductor over at least a portion of the first electrode; and forming a second electrode by forming a layer of a second conductive material, wherein the conductive material is characterized by a second work function value. Forming at least one of the first and second electrodes includes depositing a liquid-phase material.

According to another aspect a method of forming a display is provided. The method includes forming a plurality of pixel control circuits on a substrate, wherein each pixel control circuit comprises at least one two-terminal switching device being configured to regulate light from a pixel. Forming at least one two-terminal switching device includes forming a first electrode of the two-terminal switching device, wherein the first electrode comprises a layer of a first conductive material; forming a layer of an inorganic insulator or broad band semiconductor over at least a portion of the first electrode; and forming a second electrode. In one embodiment, forming the second electrode includes forming a layer of a second conductive material by a liquid-phase processing method.

These and other features and advantages of the invention will be described in more detail below with reference to the associated drawings.

DETAILED DESCRIPTION OF A PREFERRED EMBODIMENT

Introduction and Terminology

Figure 1:
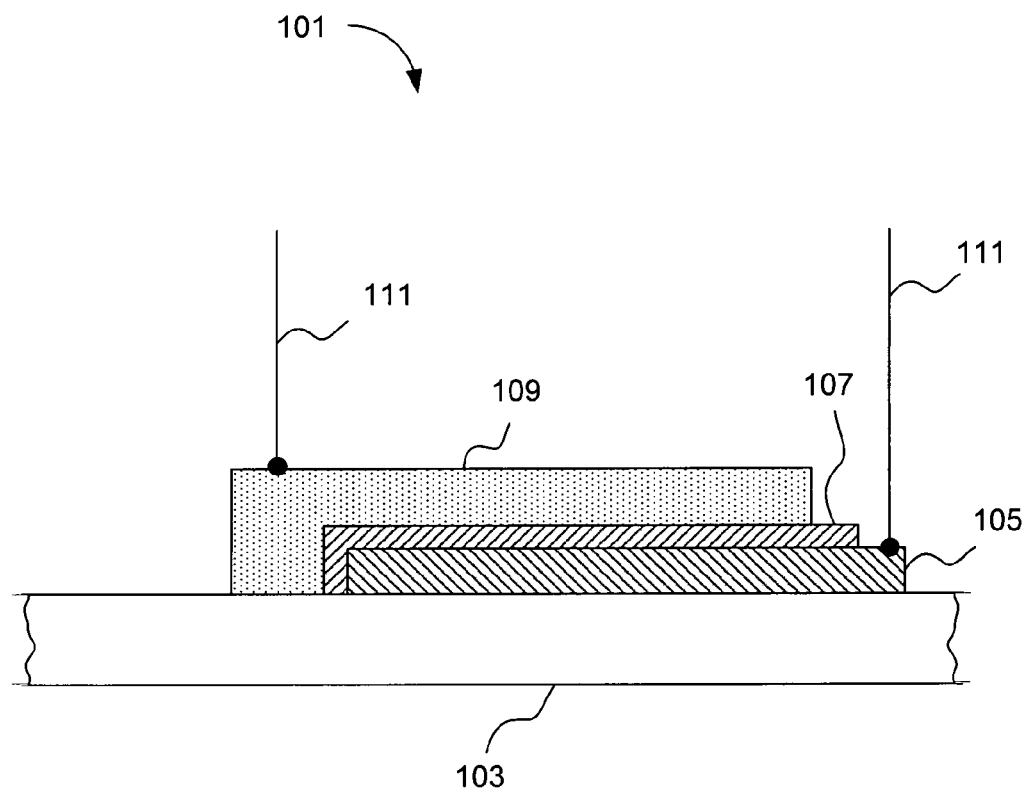
FIG. 1 presents a cross-sectional view of a MIM device in accordance with some embodiments of present invention.

As indicated, currently used MIM fabrication methods employ expensive and laborious processes. Further, these processes often require high temperature treatment, therefore limiting the materials that can be used in MIM devices to those that can withstand high temperature conditions without melting or decomposing. Conventionally, PVD and CVD processes were used for deposition of metal layers. Typically, several labor-intensive photolithographic mask steps were needed to accomplish patterning during MIM device production.

Some embodiments of the invention employ liquid-phase processing as an alternative to costly and laborious deposition operations and photolithographic patterning at least for some of the components in the MIM diode structure.

Two terminal switching devices, having at least one layer that is formed by a liquid-phase processing method, are provided by this invention. These devices, which include MIM diodes, are particularly suitable for controlling pixel performance in active LCD, EFD, and rotating element displays. Two terminal switching devices provided herein compare favorably to thin film transistors (TFTs) and thin film diodes (TFDs) fabricated by conventional methods in that they can be manufactured using relatively simple and inexpensive methods while exhibiting comparable or superior performance characteristics.

"MIM diodes", as used herein, refer to two terminal switching devices that include at least three layers: a first layer of conductive material, a layer of insulator or broad band semiconductor, and a second layer of conductive material. MIM diodes are characterized by non-linear current-voltage (I-V) profiles, that can be either symmetrical or asymmetrical. Both symmetrical and asymmetrical types of MIM diodes can be used as switching devices in backplane display applications as will be explained in more detail in the following sections.

An insulator layer or an "I-layer" refers to a layer of insulator or a broad band semiconductor. In certain embodiments, the band gap of the "insulating" layer is at least about 1.1 eV, or at least about 1.4 eV, or at least about 2 eV.

In certain embodiments the insulator layer is inorganic. Such a layer can be formed by a modification of the underlying layer, e.g., by chemical or electrochemical oxidation of an underlying metal layer. In certain embodiments the I-layer does not include any additional insulating materials except for the insulator derived from the underlying layer. In other embodiments, some or all of the I-layer is provided from a source other than the underlying layer.

"Liquid-phase processing" refers to formation of material from a liquid-containing phase material, such as a solution, a suspension, a sol-gel, or a melt. The liquid phase may contain either the material to be deposited or its precursor.

The deposition of material by liquid phase processing typically involves delivering the liquid-phase material containing the material or its precursor to an underlying layer or a substrate of the device structure. In some embodiments, the liquid phase material is delivered selectively to the final positions where it is be located in MIM devices. In other embodiments, it is delivered more broadly over a wider area of the underlying substrate and then selectively removed by a patterning process or other process. After deposition (whether selective or non-selective), the deposited liquid phase material may modified (e.g., cooled, heated, reacted, etc.) to produce a conductive layer or insulating/semiconducting layer for an MIM device.

The liquid phase material can be delivered by a variety of methods known by those of skill in the art. These include immersion, coating, droplet based printing (e.g., ink jet printing), gravure printing, silkscreen printing, thermal transfer printing, offset printing etc. Coating methods include spin-coating, spray-coating, bar-coating, dip-coating, slot coating and the like.

As indicated, the liquid phase material may be delivered in a patterned manner (e.g., printing a pattern), so that no additional patterning is required after material is deposited. Such deposition reduces the necessity of costly and laborious photolithographic patterning.

After the liquid phase material has been delivered to the partially fabricated device, the material can be formed in a number of ways. These include solvent evaporation, cooling or heating of the liquid phase, chemically or electrochemically treating a precursor in the liquid phase, treating a material or its precursor in a liquid by irradiation or high temperature to cause material precipitation. Specific examples include, evaporation of solvent from a printed solution of an ink, electroplating a metal, depositing a metal by electroless deposition, depositing material by cooling a melt, etc.

In some embodiments, it is preferable to use liquid-phase deposition for the top electrode of the MIM device (i.e., the electrode further removed from the underlying substrate), while remaining MIM components may be formed by conventional methods. In other embodiments, the lower electrode (the one closest to or contacting the substrate) is fabricated by a liquid-phase deposition process. Thus, in one example, the MIM fabrication sequence is M (non-liquid phase)-I (non-liquid phase)-M (liquid phase). In another example, the sequence is M (liquid phase)-I (non-liquid phase)-M (liquid phase). In yet another example, the sequence is M (liquid phase)-I (non-liquid phase)-M (non-liquid phase). A further three embodiments, employ liquid phase deposition processes for the I-layer as a variation of each of the preceding three examples. In each of these embodiments, certain embodiments fabricate at least one of the liquid phase layers by a printing process.

Two-Terminal Switch Structure

An example of a MIM diode structure, according to one embodiment of the present invention is shown in FIG. 1. In this embodiment, the MIM diode is a three-layer device, with an insulating layer residing between two layers of conductive materials. It is understood, that in other embodiments MIM device may include additional layers, or any of the three layers may comprise two or more sub-layers forming a stack. A cross-sectional view of a simple MIM diode is presented. The diode 101 resides on a substrate 103 and includes a first electrode layer 105, an insulating layer 107, and a second electrode layer 109. Electrical contacts 111 connect the electrodes 105 and 109 to address lines, a display element, other elements of a pixel control circuit, etc. In certain embodiments, the upper electrode is connected directly to a display element such as an LCD pixel.

MIM diodes having a surface area of about 100 square microns and larger were prepared and were found suitable for active matrix display application. For example, 100 by 100μ and 150 by 150μ devices were tested. Thus, devices with areas of less than about 20,000μ$^2$, less than about 10,000μ$^2$, and, in some cases, less than about 1,000μ$^2$ could be fabricated. Device area can be further minimized when lateral MIM devices are fabricated as will be described in the following sections.

Substrate

The substrate 101 is typically made of an insulating material that does not allow shorting of multiple switch devices residing on such substrate (e.g., as a matrix of switching devices). In certain embodiments, the substrate may include a conductive material (e.g., a metal), but in such cases a protective insulating coating is typically employed to prevent shorting of switches. Suitable substrate materials include glasses, crystalline wafers, polymeric materials (e.g., plastics) and stainless steel foils. For example, polyethyleneterephthalate (PET) can be used. Substrates can be either rigid or flexible. In certain embodiments substrates have a melting point lower than about 300 C or even about 200° C., which is possible because switch fabrication according to some embodiments of the invention does not include exposure to temperatures higher than 300 or 200° C.

First Electrode

The first electrode 105 is also sometimes called the "bottom" electrode to indicate that is the electrode closest to an underlying substrate. Typically, though not necessarily, it is formed directly on the underlying substrate. The first electrode may include any suitable conductive material. In certain embodiments, it includes a "conductive" layer or material having a conductivity of at least about 0.1 S/cm.

A variety of metals or conductive metal oxides can be used as conductive layers. For example, metals such as Ti, Ta, Al, In, Nb, Hf, Sn, Zn, Zr, Cu, Sm, Cd, Mn, Fe, Cr, Ni and Y can be employed. Alloys of these metals with each other, such as TaAl and TiAl, or with other metals are also suitable conducting materials for the first electrode. Suitable metals include metals that can be deposited by liquid-phase processing, such as paste printing, electroless deposition or electroplating. Examples of such metals include Au, Ag, Ni, Co, Cu, which can be used as conductive inks for paste-printing. In selected embodiments alkaline-earth metals, such as Ca, Ba and Mg can be used. Rare earth metals, such as Sm and other lanthanides are also suitable. In other embodiments, conductive metal oxides are used as first electrode materials. These include but are not limited to stoichiometric or non-stoichiometric zinc oxide, indium oxide, tin oxide, aluminum tin oxide, indium tin oxide (ITO), indium zinc oxide (IZO) and aluminum zinc oxide (AZO) materials. Composites of any of the above listed conductor pastes with organic binders, or composites of metal oxide or chalcogenide nanoparticles (conductive or nonconductive, such as $Ag_xO_y$, $Cu_xO_y$, $Cd_xO_y$, $Ca_xTe_y$) with conducting organic binders, such as conductive polymers or ionic surfactants may be used. Yet in other embodiments, the bottom electrode may include organic conducting materials, conducting forms of carbon, or conducting organic-inorganic materials (e.g., metal complexes with organic ligands). In selected embodiments, the first electrode (whether inorganic, organic, or combination thereof) is deposited by a solution-based process. For example, a silver (Ag) layer can be formed from a printed silver paste, or a gold (Au) layer can be formed by electrodeposition, electroless plating, or printing on a substrate. In some embodiments the first electrode includes metal nanoparticles, such as silver or gold nanoparticles, which can be deposited by liquid phase processing, such as by inkjet printing.

The first electrode 105 may be a single layer of material or may be formed of several layers forming a stack, e.g., metal/conducting polymer, conducting polymer/metal/conducting polymer or dielectric layer/metal/conducting polymer configurations may be used. In addition to traditional metals and alloys, doped semiconductors (both organic and inorganic) can also be used as the contact material of the first electrode. The thickness of the first electrode is not critical and can be from hundreds of Angstroms to hundreds of microns or thicker.

Insulating Layer

As indicated, the insulating layer 107 in MIM devices of this invention typically includes an inorganic component. In many cases, the insulating layer is entirely inorganic, with no organic component. In some embodiments, the insulating layer may include a semiconducting material with a conductivity from about $10^{-14}$ to $10^{-1}$ S/cm. In certain embodiments, a 'dielectric' or an 'insulating' layer of material has a conductivity typically lower than $10^{-10}$ S/cm. Large gap semiconductors such as those having a band gap of at least about 1.1 eV may be employed.

As shown, the insulating layer 107 typically resides in direct contact with the first electrode. A variety of insulating or semiconducting metal oxides and metal salts can be used in the I-layer. For example stoichiometric and non-stoichiometric oxides, nitrides and chalcogenides (e.g., sulfides) of Ti, Ta, Al, In, Nb, Hf, Sn, Zn, Zr, Cu, Fe, Ni, Mn, Cr, Au, Ag, Co and Y metals can be used. Other suitable compounds include oxides, nitrides, and chalcogenides of Sm and other rare-earth metals and, in some embodiments, oxides, nitrides and chalcogenides of alkaline earth metals, such as Ba, Ca, and Mg. Composite oxides and inorganic ceramic nanocomposites, such as $Y_xBa_yO_z$ (e.g., $YBaO_3$) and $Sm_xSn_yO_z$ ($Sm_2Sn_2O_7$) are also suitable. In selected embodiments, I-layer may contain such insulators as SiN and SiC. In some embodiments the I-layer 107 includes inorganic semiconductors, such as Si, Se, Ge, Si—Ge alloys, CdS, CdSe, GaAs, ZnS, $TiO_2$, CuO, etc. Broad band inorganic semiconductors with a band gap of at least about 1.1 eV, or at least about 1.4 eV, or at least about 2 eV are preferred. In some embodiments, blends and composites of the above mentioned oxides, nitrides, and chalcogenides (sulfides, tellurides, and selenides) with each other or with other materials may be used in the I-layer. In some embodiments, the I-layer includes doped insulating or semiconducting materials. The dopants may include small amounts of materials with a different number of valence electrons from the number of electrons in the bulk material, such as commonly used in semiconductor industry. Composite oxides, wherein one of the oxides in the composite serves as a dopant may also be used. Examples of such doped oxides include $ZrO_2$ doped with $Y_2O_3$, $Ta_2O_5$ doped with $ZrO_2$, $Y_xBa_yO_z$, $Sm_xSn_yO_z$ etc.

Various techniques may be employed to prepare the insulating layer. Some involve directly depositing the insulating layer on the bottom electrode by a liquid phase technique (e.g., one of those identified above for electrode) or another technique (e.g., sputtering, evaporation, CVD, PECVD, etc.). For example, SiN and SiC can be deposited by PECVD method. Other techniques involve conversion or modification of some or all of a previously formed layer such as bottom electrode to an insulator or semiconductor. For example, the process may involve chemically reacting or otherwise modifying at least a portion the underlying layer. For example, an underlying metal of electrode 105 can be chemically modified (e.g., oxidized) to form a metal oxide, metal sulfide, metal nitride, or the like.

The thickness of an I-layer is an important parameter that may influence the electric performance of the switching device. Typically in diodes intended for display applications an I-layer is from about 15 to about 500 nm thick. For example, diodes with I-layer thicknesses of 20-200 nm were fabricated and used. Of course, the actual thickness depends in part on the type of material employed as the I-layer and, especially on its dielectric constant. Note that for some embodiments, larger diodes with I-layers of greater thicknesses than 500 nm may be desirable.

In certain embodiments inorganic material of an I-layer may be blended with organic insulators or semiconductors material to form a composite material. In other embodiments, a distinct layer of organic semiconductor material may be optionally added to the three-layer structure of the switch.

According to some embodiments organic semiconductor layer (not shown) resides between the inorganic insulating layer 107 and the second electrode 109. Examples of types of organic semiconductors include conjugated polymers, polymer blends, polymer/molecule polyblends, layers of organic molecules, organometallic molecules, or molecular blends (alloys); or a multilayer structure combining the above materials. Examples of specific organic semiconductors include polyacetylene (PA) and its derivatives, polythiophene (PT) and its derivatives, such as poly(3-hexylthiophene) (P3HT), poly(p-phenyl vinylene) (PPV) and its derivatives such as poly(2-methoxy,5-(2'-ethylhexyloxy)-1,4-phenylene vinylene) (MEH-PPV), polypyrrole, ("PPY"), and its derivatives; poly(2,5-thienylenevinylene), ("PTV"), and its derivatives; poly(p-phenylene), ("PPP"), and its derivatives; polyfluorene, ("PF"), and its derivatives; polycarbazole and its derivatives; poly(1,6-heptadiyne); polyquinolene and semiconducting polyanilines (i.e. leucoemeraldine and/or the emeraldine base form). Representative polyaniline materials are described in U.S. Pat. No. 5,196,144 which is incorporated herein by reference. Other suitable semiconducting materials include fullerene molecules such as $C_{60}$ and its derivatives, bucky tubes, anthracene, tetracene, pentacene, Alq3 and other metal-chelate (M-L3) type organometallic molecules and so on. Of these materials, those which exhibit solubility in organic or aqueous solvents are preferred because of their processing advantages.

Examples of PPV derivatives which are soluble to common organic solvents include MEH-PPV (F. Wudl, P. -M. Allemand, G. Srdanov, Z. Ni and D. McBranch, in Materials for Nonlinear Optics: Chemical Perspectives, edited by S. R. Marder, J. E. Sohn and G. D. Stucky (The American Chemical Society, Washington D.C., 1991), p. 683), poly(2-butyl-5-(2-ethyl-hexyl)-1,4-phenylenevinylene), ("BuEH-PPV") [M. A. Andersson, G. Yu, A. J. Heeger, Synth. Metals 85, 1275 (1997)], poly(2,5-bis(cholestanoxy)-1,4-phenylenevinylene, ("BCHA-PPV"). Examples of soluble PTs include poly(3-alkylthiophenes), ("$P_3AT$"), wherein the alkyl side chains contain more than 4 carbons, such as from 5 to 30 carbons.

Organic layers can be fabricated using donor/acceptor polyblends in the insulator or semiconductor layer. These polyblends can be blends of semiconducting polymer/polymer, or blends of semiconducting polymer with suitable organic molecules and/or organometallic molecules. Examples for the donor of the donor/acceptor polyblends include but are not limited to the conjugated polymers just mentioned, that is PPV, PT, PTV, and poly(phenylene), and their soluble derivatives. Examples for the acceptors of the donor/acceptor polyblends include but are not limited to poly(cyanaophenylenevinylene) ("CN-PPV"), fullerene molecules such as $C_{60}$ and its functional derivatives, and organic molecules and organometallic molecules used heretofore in the art for photoreceptors or electron transport layers.

Organic and inorganic semiconductors of the switch device may be doped with one or more dopants. Extra charge carriers commonly result from dopants with different valence electrons. A doped semiconductor with electrons as majority charge carriers is called n-type semiconductor and a doped semiconductor with holes as majority charge carriers is called p-type semiconductor. The doping levels in the layer 107 and in the organic semiconductor layer can distribute inhomogeneously and can change sign from p-type to n-type (which forms a p-n junction inside these layers) or from p-type to undoped region then to n-doped region (which forms a p-i-n junction inside these layers). Yet in other embodiments the insulating layer is undoped, e.g., includes only undoped metal oxides.

A variety of charge transfer compounds may be included in the semiconductor layer (either alone or in a mixture with other semiconductor materials described above). Such charge transfer compounds are known to those of skill in the art and include but are not limited to charge transport molecules comprising oxadiazole groups, such as 2-(4-biphenyl)-5-(4-tert-butylphenyl)-1,3,4-oxadiazole (PBD), and charge transport molecules comprising arylamine groups, such as 4,4'-bis[N-(1-naphthyl)-7V-phenylamino]biphenyl (NPB), and 4,4'-bis[N-(3-methylphenyl)-N-phenylamino]biphenyl (TPB).

In some embodiments, the switching devices described herein include a layer of interface-modifying material, which may reside, e.g., between the I layer 107 and the second electrode 109. In general, the interface-modifying layer may reside at any interface in the device structure. The interface-modifying layers may include semiconducting and insulating materials. In those cases when insulating materials are used for interface modification, the layer is typically very thin, e.g., it may have a monomolecular thickness, thus allowing charge carriers tunnel through it.

The interface-modifying material typically improves the interfacial properties between the two-layers. For example a layer of interface-modifying material may reside at the interface between layers 107 and 109 in contact with these two layers. This layer may be also referred to as the surface modification layer, since it modifies the surface in a partially fabricated device onto which it is deposited. In some embodiments the interface-modifying layer includes one or two components. The first component modifies the surface of the layer onto which it is deposited. For example, the first component may covalently bond or otherwise modify hydrophilic moieties residing at the surface of a metal oxide layer. For example, OH groups may be modified. The second component of the interface-modifying layer may provide a surface with desirable characteristics for deposition of the second layer, e.g., for liquid-phase deposition of the second electrode. In some embodiments, the second component may provide the desirable wettability characteristics to a surface, onto which the conductive ink is to be deposited. For example, the interface-modifying material and the conductive ink may be selected such as to minimize wettability and to thereby obtain electrodes of very small size by liquid-phase methods. For example, interface modifying compounds, including fluorine-substituted alkyl groups are found useful to minimize wettability and allow printing of electrodes with thin line widths. In other embodiments, forming well-wettable surfaces prior to liquid-phase deposition of electrodes may be desirable.

It is understood that, in general, the interface-modifying layer can be used to improve at least one property of an interface. For example, removal and modification of OH groups and $H_2O$ residing on the metal oxide layer can reduce the incidence of pinholes at the interface between the I-layer and the second electrodes.

In some embodiments, a thin monomolecular layer of an interface-modifying material is formed at the interface between the two layers of the switching device. Molecules suitable for such layers can include a reactive terminus and a "tail", wherein the reactive terminus reacts or otherwise modifies the surface onto which it is deposited, and the tail forms a new surface suitable for deposition of the second layer.

Examples of such molecules include organosilanes of the general formula $R_nSiX_{4-n}$, wherein n varies from 1-3, R is an alkyl, and X is a halogen, such as F, Cl, Br, and I. Alkyls can be substituted or unsubstituted and may include heteroatoms. In some embodiments the alkyl group has a formula $-(CH_2)_k-R'$, wherein k can range from 0-9, preferably from 1-5, and R' is an organofunctional group. Examples of R' include $-CH3$, $CF_3$, $CF_2CF_2CF_3$, aryl group, etc. In some embodiments, fluorine-substituted alkyls are preferred. For example, compounds of the general formula $CF_3(CF_2)_l(CH_2)_mSiX_3$, wherein l and m can independently vary from 0-9, e.g. from 1 to 8, can be used. Variation of l and m can be used to tune the wettability of the surface to a particular ink and to optimize the dimension of the printed top electrode pattern. In a particular example, tridecafluoro-1,1,2,2-tetrahydrooctyl)trichlorosilane $CF_3(CF_2)_5CH_2CH_2SiCl_3$ was used in an interface modifying layer. This molecule includes a reactive terminus $-Si-Cl_3$, and a tail $CF_3(CF_2)_5CH_2CH_2-$. During vapor priming process, the organosilane molecule is introduced into a vacuum chamber containing the substrate. All three Si—Cl bonds in the molecule react with the H atoms and $H_2O$ residing on the surface of the metal oxide thereby forming O—Si covalent bond. As a result, a thin, pinhole free insulating layer is formed. The "tail" portion of the molecule forms a good surface for deposition of conducting inks.

A variety of other compounds which include reactive moieties may be used. Examples include alkylsylanes, having a Si—N bond (e.g., hexamethyldisalazane), alkylsylanes with a Si—O bond, etc. Further, interface-modifying compounds are not limited to organosilicon molecules, and can include organometallic molecules (e.g., those with metal-halogen bonds), and organic molecules with a reactive groups (certain reactive carbon-halogen bonds etc.). Interface-modifying compounds comprising unsaturated bonds (such as bonds with sp2 bonding) in the organic segment can also be used.

Second Electrode

In general, second electrode 109 can employ any conductive material, such as those listed for the first electrode. In certain embodiments, the second electrode 109 of the switching device 101 is formed using liquid-phase processing methods. It is, therefore desirable, to employ materials that can be formed or deposited using such methods. These include materials that can be electroplated or deposited by electroless deposition, or deposited from solution, suspension, sol-gel, a melt, etc. by a variety of techniques, such as solvent evaporation, chemical treatment, irradiation, thermal treatment, etc. Examples of these materials include metals, such as Au, Ag, Ni, Cu and the like; conductive metal oxides, such as indium oxide, tin oxide, or indium tin oxide; conductive composite materials, conductive forms of carbon, such as substituted or unsubstituted fullerenes, carbon nano-tubes and graphite nano-particles, conductive metal complexes and the like. These materials can be doped with charge-providing materials, such as salts providing +1, +2, +3 charged cations and −1, −2, and −3 anions. Examples of such cations and anions include lithium, sodium, potassium, cesium, calcium, barium, aluminum, tetraalkyl ammonium (e.g., tetrabutyl ammonium, tetraethyl ammonium, tetrapropyl ammonium), phenyl ammonium cations, and anions such as trifluoromethane sulfonate, trifluoroacetate, tetraphenylborate, toluene sulfonate, and hexafluorophosphate.

In certain embodiments, organic conductive materials, such as conductive polymers and oligomers are found to be particularly suitable. Conductive substituted or unsubstituted polythiophenes (PT), such as poly(3,4-ethylenedioxythiophene) (PEDOT), polypyrroles (PPY), polyanilines (PANI), and co-polymers thereof can be used. In some embodiments blends of neutral conjugated PFs, PPVs and PTs and charge-transporting polythiophenes (e.g., doped polythiophenes), polyanilines and polypyrroles can be used in a top electrode 109.

Organic conductive materials often include dopants that increase their conductivity. These dopants may be organic or inorganic (e.g., such as those described above). Preferred organic dopants include charged polymers, such as poly(styrenesulphonate) (PSS), which is commonly used in PEDOT:PSS and PANI:PSS combinations. Other suitable inorganic dopants include certain metal oxides (e.g., $TiO_2$,), dimethylsulfoxide (DMSO), and carbon black, which are commonly used in, for example, $PPY:TiO_2$, and PPY:Carbon black and PEDOT:DMSO combinations.

In some embodiments metal nanoparticles, such as silver and gold nanoparticles are used in the second electrode. These materials can be deposited by a liquid-phase processing method such as inkjet printing.

According to some embodiments, materials used for second electrode layer are soluble in a polar or a non-polar solvent. Polar or non-polar organic solvents, such as alcohols (e.g., methanol), acetone or hydrocarbon solvents may be used to deliver the above mentioned materials using liquid-phase processing. Materials that are water-soluble or that are soluble in organic/aqueous solutions, such as aqueous alcohols are also used in some embodiments. Such liquid media may be used, in some embodiments, to form the first electrode and/or the I-layer when a liquid phase deposition process is employed.

In general, any of the materials listed for the first electrode is suitable for the second electrode, and vice versa, materials listed above for use in the second electrode are also suitable for the first electrode.

The thickness of the second electrode, similarly to the thickness of the first electrode is not critical and can be from hundreds of Angstroms to hundreds of microns or thicker.

Electrical Performance of the Switching Device

Electrode materials of the switch device are characterized by a work function value that determines material's ability to inject electrons into the I-layer of the switch. Performance of the switch device depends on work function values of the two electrodes and on the difference between these two work functions. Typically, an electrode with higher work function is referred to as an anode.

It was demonstrated that in certain MIM devices presented herein, work function difference between the top and bottom electrode materials determines the symmetry of an I-V characteristic of the device. Typically, the greater the work function difference between the first and second electrode materials the more asymmetrical is the I-V profile of the switch.

When similar or identical materials are used for first and second electrodes or when work function difference between these two materials is small (e.g., less than about 200 meV or, in some cases less than about 100 meV), MIM devices with symmetrical I-V characteristics are produced. Examples of pairs of materials with small work function differences include Al/Ta, Al/Ti, Ti/Ta, Al/Ag, Au/PEDOT, etc. Switches with symmetrical I-V characteristic are particularly suitable for controlling pixel performance in LCD displays.

When work function difference between the two electrodes is large (e.g., at least about 100 meV or, in some cases, at least about 500 eV, for example, as high as 3 eV) MIM devices with asymmetrical work function are typically produced. Switches with asymmetrical I-V characteristic are particularly suitable for controlling pixel function in electrophoretic and rotating element displays.

Note that some classes of MIM devices are insensitive to work function differences between the two electrodes. MIM devices with aluminum nitride insulator layers, for example, appear to always have asymmetric I-V characteristics, regardless of what types electrodes are employed, even when the work function difference between the electrodes is relatively small.

While work function is an intrinsic property of a material and does not significantly depend on the method of material deposition, it does depend on the detailed morphology and/or physical-chemical structure of a material. Therefore, materials can be tailored to have a specific work function associated with desired electrical performance. For example, tailoring may include changing the amount of oxygen in non-stoichiometric metal oxides, such as ITO, using specific dopants, changing dopant concentration, changing alloy composition in metal alloys etc. Organic conductive materials are particularly advantageous in this respect, since a wide variety of compounds having different work functions can be used. Work function of organic conductors can be relatively easily modified using structural modifications and dopants. Therefore, in some embodiments, present invention provides a method of forming MIM diodes with a better controlled electrical performance.

Apart from work function values, the thickness of an I-layer is an important parameter. Generally, the thicker the insulator, the lower is the capacitance and the higher is the turn-on voltage.

The current-voltage (I-V) characteristics of the devices shown in FIG. 1 may be symmetric or asymmetric. As demonstrated in the Examples, the rectification ratio (defined as the ratio of forward current to reverse current at a given bias magnitude) can be as high as $10^6$-$10^7$; i.e., conductive in the forward bias direction and insulating at zero and in reverse bias. The switching property can be characterized by the rectification ratio $I(V)/I(-V)$, or the switching ratio (a current ratio at two given voltages $I(V_1)/I(V_2)$ in which $I(V_1) > I(V_2)$). A special situation is $V_2=0$. As demonstrated in the Examples of this invention, the switching ratio $I(V_1)/I(V_2)$ can be higher than $10^{10}$ for $V_2$ close to 0 V.

While switching diodes described herein may include materials similar or identical to those found in capacitors, the two devices are fundamentally different in purpose, structure, and mode of operation. While both capacitors and MIM diodes typically include a layer of insulating material residing between conductive electrodes, the diodes are built such that capacitance of the device is minimized while carrier injection is maximized, thus allowing for high current/capacitance ratios. Capacitors, quite oppositely, are built to maximize capacitance and to minimize carrier injection, thereby having low current/capacitance ratios.

The MIM diodes described herein are characterized, in one embodiment, by low values of capacitance per given device area, with values of less than about 1.5 μF/cm², preferably less than about 1 μF/cm² being desired for good switching performance. In one example, switching devices having capacitance per area values ranging from about 0.1-1 μF/cm² have been fabricated. These characteristics are different from characteristics found in capacitors, where maximized capacitance per area is preferred.

The current/capacitance ratios of greater than about 0.01 mA/nF, (e.g., about 0.015 mA/nF) are typical for MIM diodes. In contrast, capacitors are designed to minimize leakage current and to maximize capacitance. Typical leakage current in commercial electrolyte capacitor of 1 mF ($10^6$ nF) is smaller than $10^{-2}$ mA. The current/capacitance ratio in such capacitor is typically smaller than $10^{-8}$ mA/nF.

On a structural level, capacitors often employ porous electrode surfaces in order to maximize surface area for a given device volume, and to achieve higher capacitance values. For example, the electrode surface in capacitors may be intentionally roughened after deposition, or may be deposited by a method that results in the formation of pores and voids. In contrast, the MIM diode structures described herein, typically employ smooth and non-porous electrodes, resulting in minimized capacitance of the diode. Roughening of electrode surface is typically not desired. In one example, MIM diodes having non-porous tantalum cathode are provided by sputtering tantalum, followed by partial anodization of tantalum, without substantially roughening the tantalum surface.

The diodes and capacitors may also differ in mode of operation. Many types of capacitors are electrolytic in nature with an oxidation/reduction reaction occurring at the electrodes. Such capacitors also typically include a layer between the electrodes, which provides high ionic conduction but negligible electron conduction. In contrast, the diodes described herein, typically do not rely on a chemical reaction for their function. In many embodiments, operation of MIM switching devices involves only electronic current with negligible ionic motion.

Thus, while diodes and capacitors can have a "MIM" structure, e.g., Ta/Ta$_2$O$_5$/PEDOT or Ta/Ta$_2$O$_5$/MnO structures, the diodes typically have non-porous electrodes, and conform to dimensions (layer areas and layer thicknesses) required to maintain desired low capacitance/area ratios and high current/capacitance ratios, as was described above. It is understood, that in some embodiments, the diode electrodes may have some level of porosity, as long as such porosity does not substantially compromise the switching performance of the device.

Methods of Fabrication of Two-Terminal Switch Structure

As mentioned, a variety of methods can be used to form MIM devices. It is advantageous to use liquid-phase processing to form at least one layer of a MIM device. While both MIM electrodes and an I-layer may be formed by liquid phase processing, it is especially advantageous to form the top electrode by this method.

Figure 2:
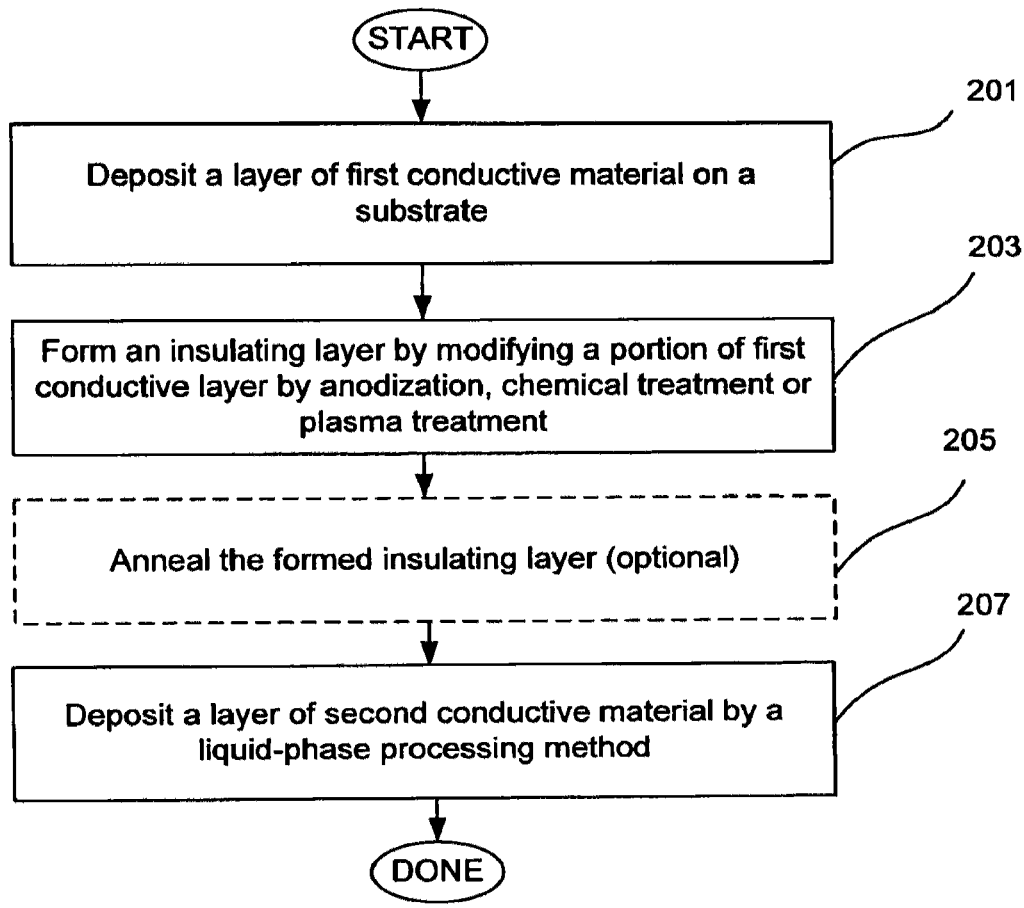
FIG. 2 is an example process flow diagram for a process of fabricating a MIM device in accordance with some embodiments of present invention.

One example of a fabrication method of a two-terminal switch in accordance with certain embodiments of the invention is illustrated in FIG. 2. This example refers to a MIM device that has an inorganic insulating layer formed by modification of an underlying layer and has a top electrode formed by a liquid-phase processing method. E.g., in this method the top portion of the first electrode may be modified to thereby form a metal/metal oxide bilayer. Such a sequence is superior to other methods since it minimizes the amount of laborious patterning steps conventionally required for MIM device fabrication. Preferably, according to the process flow diagram shown in FIG. 2, only the bottom electrode layer may need to be patterned, while the insulating layer is formed conformally over the patterned bottom layer, and the top electrode layer is deposited by a liquid-phase processing method, such as printing, and therefore may not require a separate patterning step. It should be recognized, that in alternative embodiments different fabrication sequences may be employed, e.g., the insulating layer may be deposited from extraneous sources, or top electrode may be deposited by conventional methods, such as PVD, CVD, PECVD, etc.

Formation of a Bottom Electrode

Referring to FIG. 2, a layer of first conductive material is deposited onto a substrate in the first operation 201. A variety of deposition methods can be used. These include PVD methods, such as sputtering and evaporation (including thermal evaporation, electron beam evaporation end the like), thermal deposition, CVD methods, plasma-enhanced (PECVD) methods, and photo-organic deposition methods (PODM), all well known to those skilled in the art. In selected embodiments electroplating and electroless deposition methods can be used, where appropriate. In other embodiments, printing can be used. For example, a variety of metals, such as Ti, Ta, Al etc. can be thermally deposited; certain metals, such as Au, Cu, and Ni can be electroplated or electrolessly deposited; while some metals, such as Ag and Ni can be printed on a substrate. Other materials, such as organic conductive materials or conductive oxides can be deposited by a variety of liquid-phase processing methods.

If necessary, the conductive layer deposited on a substrate is patterned using conventional patterning methods (e.g., lithography techniques), and an insulating layer is formed over at least a portion of the first conductive layer in the following operation 203. Several methods can be used to form the insulating layer. In some embodiments, a portion of the first electrode can be modified to form an insulator layer by, for example, chemical, plasma or electrochemical treatment. According to some embodiments, an upper portion of the first electrode metal layer can be anodized to form metal oxide.

Anodization

Anodization is a particularly suitable technique, since it conformally covers the first electrode metal layer with a thin layer of metal oxide, typically in a self-limiting fashion.

The anodization operation is typically performed by immersing a partially fabricated MIM structure into an anodizing solution, wherein the conductive layer of first electrode is connected to an anodizing potential source. The anodizing solution typically includes an aqueous solution of an acid, such as phosphoric acid, boric acid, or citric acid. It was discovered that a salt (such as a tartrate, a citrate or a phosphate) when used instead of an acid leads to improved anodization. In some embodiments anodizing solution may also contain ionic surfactants. According to some examples, after an anodizing potential has been applied for about an hour, a thin layer of metal oxide is formed on the surface of the substrate.

When anodization is performed on a patterned metal layer which has electrically isolated portions of metal, in order to form metal oxide over these electrically isolated portions, they need to be electrically connected. Typically a temporary removable conducting material such as silver paste is applied to the patterned metal layer of the first electrode before anodization is performed, and is removed after anodization is complete by washing the silver with a solvent, such as propyl acetate. Anodization typically results in formation of an insulating metal oxide over the entire surface of the patterned metal layer, unless it was intentionally protected. In some embodiments, intentional protection of a portion of bottom electrode metal layer, may be used to form a via. Such a via may be used for connecting bottom electrode to the pixel-driving circuit., Chemical Modification Other methods of forming the insulating layer by modifying the upper portion of first electrode may be used. For example, chemical modification or modification by a plasma treatment can be used. In some embodiments, metal oxides, sulfides, or nitrides may be formed by treating the underlying metal layer with an appropriate chemical, e.g. $O_2$, $H_2S$, or $NH_3$. In some embodiments, thermal oxidation or oxidation by a chemical vapor treatment may be used. For example, a portion of titanium layer can be thermally oxidized in $O_2$ atmosphere to form titanium oxide. In other cases $H_2O$ vapor may be used as an oxidant. Chemical treatment in some cases may be performed by a mild solution-based process and does not necessarily involve high-temperature treatment. For example the partially fabricated substrate can be immersed into a solution saturated with $H_2S$ or $CS_2$ used to form metal sulfides.

Plasma Treatment

In some cases, the chemical reaction may be plasma assisted. For example, metal oxides, can be formed by exposing metal to a plasma with an oxygen source, e.g. $O_2$. In one example aluminum oxide insulator layer was prepared by exposing aluminum bottom electrode layer to an $O_2$ plasma.

When an insulating layer is formed by modifying an underlying layer of the device by, e.g., anodization or some types of chemical treatment, the resulting device typically has an entire bottom electrode encapsulated in an insulating material. This is an advantageous feature of this method because such encapsulation prevents shorting between top and bottom electrodes of the MIM structure, which might otherwise occur around the edges of the insulating layer.

Methods Using a Sacrificial Layer

In some embodiments, it is advantageous to use an insulating layer material that is not derived from the conductive layer of the first electrode. One technique for fabricating an insulating layer includes depositing a "sacrificial layer" of a precursor on top of a first electrode, followed by completely converting this sacrificial layer into a layer of an insulating material by anodization, plasma treatment, chemical modification, etc. For example, and ITO/$TiS_2$ bilayer can be formed by depositing a thin sacrificial layer of $Ti(OPr^i)_4$ onto an ITO layer of the first electrode, followed by converting the sacrificial layer to $TiS_2$ by exposing the partially fabricated device to $H_2S$ or $CS_2$. Other techniques employ complete conversion of a metal layer to a metal oxide layer. For example, the first or bottom electrode may be formed from silver or aluminum. A tantalum metal layer may be formed on top of the bottom electrode. This tantalum layer is then completely oxidized via anodization or plasma treatment for example to produce a layer of tantalum oxide.

Annealing (Optional)

Upon formation of an inorganic layer in operation 203, the inorganic layer can be optionally annealed in an operation 205, by, for example, thermal treatment. In some embodiments, metal oxides formed by anodization are annealed by exposing the partially fabricated device to a temperature of about 60-200° C. for about 0.25-3 hours.

Deposition of an Organic Semiconductor Layer (Optional)

In some embodiments, after the inorganic layer is formed but before formation of the second electrode, optionally an organic semiconductor layer may be deposited, typically by a liquid-phase processing method.

In some embodiments a thin, e.g., monomolecular, interface-modifying layer of an insulating material is deposited on top of the inorganic layer. A variety of organic molecules, including organosilicon, and organometallic compounds can be used. The layer can be deposited, for example, by vapor priming, spin-coating, dipping, etc. Other deposition methods may be used, depending on the properties of the priming compound and process requirements. In one example, organosilicon compounds are deposited by vapor priming in a chamber, such as those used in a semiconductor processing industry. For example, YES-1224 vapor priming apparatus available from Yield Engineering Systems may be used. Liquid-phase deposition methods include spin-coating, dipping, and other methods, known to those of skill in the art. In some embodiments, solutions of priming compounds in appropriate solvents are formed and are deposited onto the surface that needs to be modified. Excess solvent can be later removed by thermal post-treatment of the substrate.

Formation of Top Electrode

In certain embodiments, the conducting material of a top electrode is deposited by a liquid-phase processing method. As explained above, liquid-phase processing methods include printing, coating, electroplating, electroless deposition etc. For example, silver, and certain conductive inks as described in previous sections can be printed onto an underlying layer of the MIM device. Material of top electrode can be applied from a solution, a suspension, a sol-gel, or a melt. In some embodiments the material is deposited in a patterned manner. In some embodiments this patterning is performed by pre-treatment of an underlying layer or a substrate layer as described in US Published Patent Application No. 2004/0179146, filed Jan. 16, 2004, naming Nilsson as inventor, which is incorporated herein by reference in its entirety and for all purposes.

Suitable liquid dispensing techniques include immersion, coating, droplet based printing (e.g., ink jet printing), gravure printing, silkscreen printing, thermal transfer printing, offset printing etc. Coating methods include spin-coating, spray-coating, bar-coating, dip-coating, slot coating and the like.

The material can be formed from the liquid phase by solvent evaporation, cooling or heating of the liquid phase, chemically or electrochemically treating a precursor in the liquid phase, treating a material or its precursor in a liquid by irradiation or high temperature to cause material precipitation. Specific examples include, evaporation of solvent from a printed solution of an ink, electroplating a metal, depositing a metal by electroless deposition, depositing material by cooling down a melt, etc.

A variety of solvents may be used to provide a liquid phase, including polar solvent such as water, alcohols, chloroform, etc., and nonpolar solvents such as toluene, xylene, etc.

Liquid-phase deposition may be performed in a patterned manner (e.g., printing a pattern) or conductive material can be blanket deposited. In the latter case, additional patterning may be required. Additional patterning may be performed by the following methods: pre-treatment of the substrate surface before deposition of top electrode; lift-off process as known in the photoresist industry or depositing/printing a hard mask on the targeted area and removing the unmasked area by plasma treatment (e.g. $O_2$ plasma)or solvent treatment.

After the top electrode has been deposited, the formation of an MIM diode is complete. Depending on its I-V characteristics, such diode may be used in the active matrix of an LCD or in an EFD (or rotating element display).

As it can be seen, the described fabrication method reduces the number of steps that require photolithographic patterning, high temperature treatment, vacuum deposition as well as other steps associated with high costs in MIM diode production. In some embodiments, methods of this invention provide better control over electrical characteristics of the switching device and expand the range of materials that can be used for fabrication.

As it will be shown in the Examples sections, devices prepared according to these methods exhibit long operational lifetimes and good shelf stability.

Via Formation Process

In certain embodiments, a via is formed to provide an electrical connection to the bottom electrode layer. For example, referring to FIG. 1, an electrical connection between line 111 and bottom electrode 105 may need to be formed. One embodiment of a method that can be used to form a via is illustrated in FIG. 3.

Figure 3:
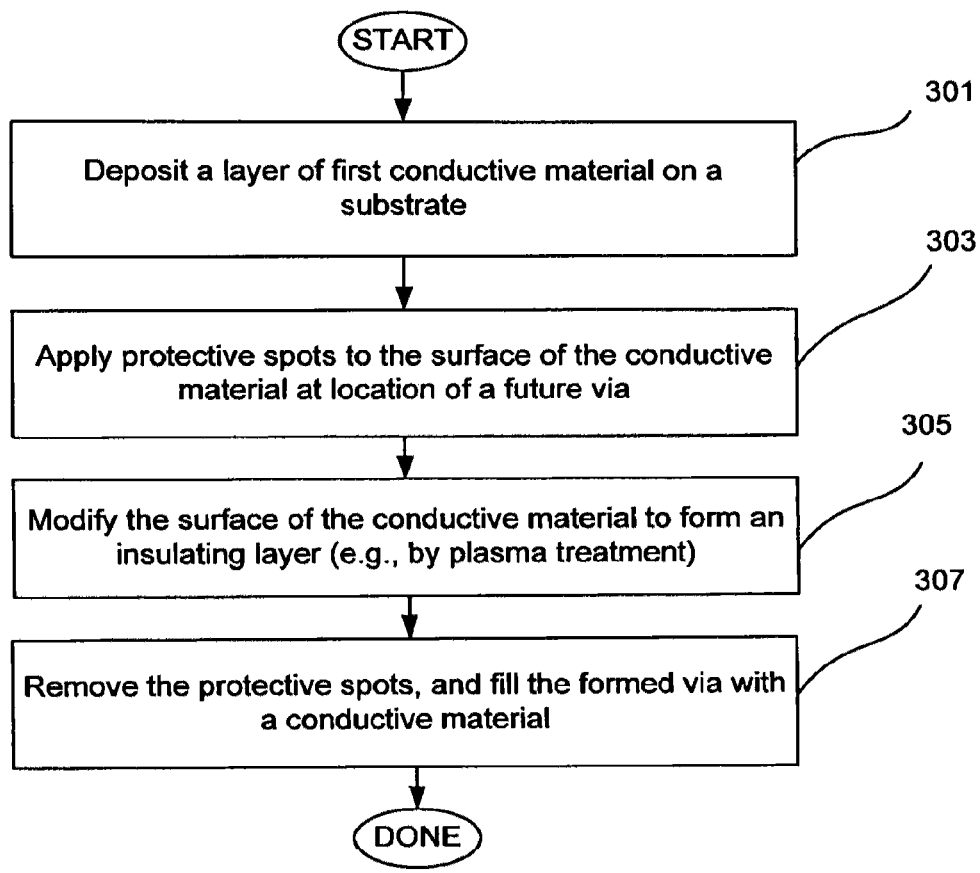
FIG. 3 is an example process flow diagram for a process of forming a via in a MIM device in accordance with some embodiments of present invention.

Referring to FIG. 3, the first electrode is formed by depositing a layer of conductive material in an operation 301. The first electrode is formed as was described above. Next in an operation 303, protective coating, e.g., protective ink is applied to specific portions of the first conductive layer in a location of a future via. Protective coatings can be deposited by, for example, one of the liquid-phase processing methods such as printing. In the next operation 305, a portion of the first conductive layer with the exception of the protected area is converted to an insulator. For example the top portion of a metal can be converted to metal oxide by an $O_2$ plasma treatment or by anodization. Next, the protective coating is removed in an operation 307 to form a via. At this point the first electrode is conformally covered with an insulator and has an exposed conductive region only in the via region. Next, the via may be filled with a conductive material. Further processing of the MIM device is performed as described above.

Lateral MIM Devices

Certain embodiments of the present invention provide "lateral" MIM devices in which the insulator or semiconductor layer is formed (at least in part) on the vertical (or vertically sloping) sides of the lower electrode. The second electrode is then formed (at least in part) on the insulator or semiconductor layer previously formed on the sides of the lower electrode. In such designs, the current travels in a direction having a lateral component (i.e., a component parallel to the top side of the first electrode (or parallel to the substrate surface)). Of course, the current direction may also, in certain embodiments, have a vertical component.

Methods for partially converting an underlying metal or conductive layer, in situ, to an insulator layer may be used to form lateral MIM devices. Plasma oxidation, anodization, chemical vapor reaction, thermal oxidation, etc. may be performed in a manner that produces "vertical" I-layers on the sides of pre-patterned bottom electrodes. Because such conversion reactions will occur on not only the top surface but also the sides of a patterned electrode, they naturally form structures that can be used in lateral MIM devices.

Certain device layouts and method operations described in U.S. Pat. No. 5,246,468 issued Sep. 21, 1993 to Takahashi et al. (incorporated herein by reference for all purposes) may be employed in lateral MIM devices of this invention. See for example the structure of FIG. 1F.

Matrix

The switching devices disclosed herein may be employed in column-row (x-y) addressable electric switch matrixes. These microswitches are two terminal devices through which electric current, electric potential or their derivatives or integrals can be switched on and off by the magnitude or the polarity of an external bias. They are made of inorganic semiconducting or insulating thin films in metal/semiconductor (or insulator)/metal, thin film configuration. Column-row addressable electric microswitch matrices can be made to cover large areas, with high pixel density. Such matrices can be integrated with one (or several) additional layer(s) such as display front planes.

Integration of switching devices into pixel control circuits has been described in detail in US Published Patent Application No. 2004/0179146, filed Jan. 16, 2004, naming Nilsson as inventor, previously incorporated by reference, and will not be further discussed herein. The pixel electrode and the corresponding driving scheme were also disclosed in U.S. application Ser. No. 11/430,075 by H. -C. Lee et al. which is herein incorporated by reference for all purposes.

While mainly described herein with the reference to active matrix display applications, asymmetric and symmetric MIM devices can be used as switches in a wide variety of systems, including memory chips in the computer industry and various microswitch boards.

EXAMPLES

Example 1

Novel Anodization Process for Forming $Ta_2O_{5-\delta}$

Tantalum film (300 nm thick) was sputtered with a DC sputtering apparatus (Kurt J. Lesker, Model PVD75) on glass substrates. The substrates were not heated. $Ta_2O_{5-\delta}$ layer was formed by converting the top portion of the tantalum film to $Ta_2O_{5-\delta}$ by an anodization process which was performed for 60 minutes and was followed by thermal treatment at a temperature of about 300° C. for approximately 20 minutes to form $Ta_2O_{5-\delta}$ layer having a thickness of about 100 nm. Aluminum metal was then thermally deposited to a thickness of about 150 nm onto the top portion of $Ta_2O_{5-\delta}$ layer to form MIM diodes with $Ta/Ta_2O_{5-\delta}/Al$ configuration.

Traditionally, Ta anodization was carried out with electrolytes containing aqueous acid solution (e.g., citric acid was used). The process of anodization in citric acid was performed as follows: ~300 nm thick Ta film was dipped into an aqueous solution of citric acid (at approximately 0.01M concentration) and Ta film was positively biased to act as an anode electrode. A stainless steel plate (or a Pt plate) was used as the counter cathode, the distance between the two electrodes being about 4 cm. The anodization process included two steps: constant current process and constant voltage process.

In a constant current process, when a constant current of, for example, 0.2 mA/cm$^2$, was applied to the Ta film, voltage drop between Ta and the cathode increased continually. The voltage in this step is linearly related to the thickness of $Ta_2O_{5-\delta}$, the relationship was about 2 nm/V. When the desired thickness of $Ta_2O_{5-\delta}$ was reached, the power supply controller was switched to constant voltage process and constant voltage was maintained until the current dropped to approximately zero (or typically to <10% of the initial current was used).

After anodization, the $Ta/Ta_2O_{5-\delta}$ plate was carefully rinsed with de-ionized water and subsequently with 2-propanol in an ultrasonic bath. All the cleaning processes were carried out at room temperature.

Figure 4A:
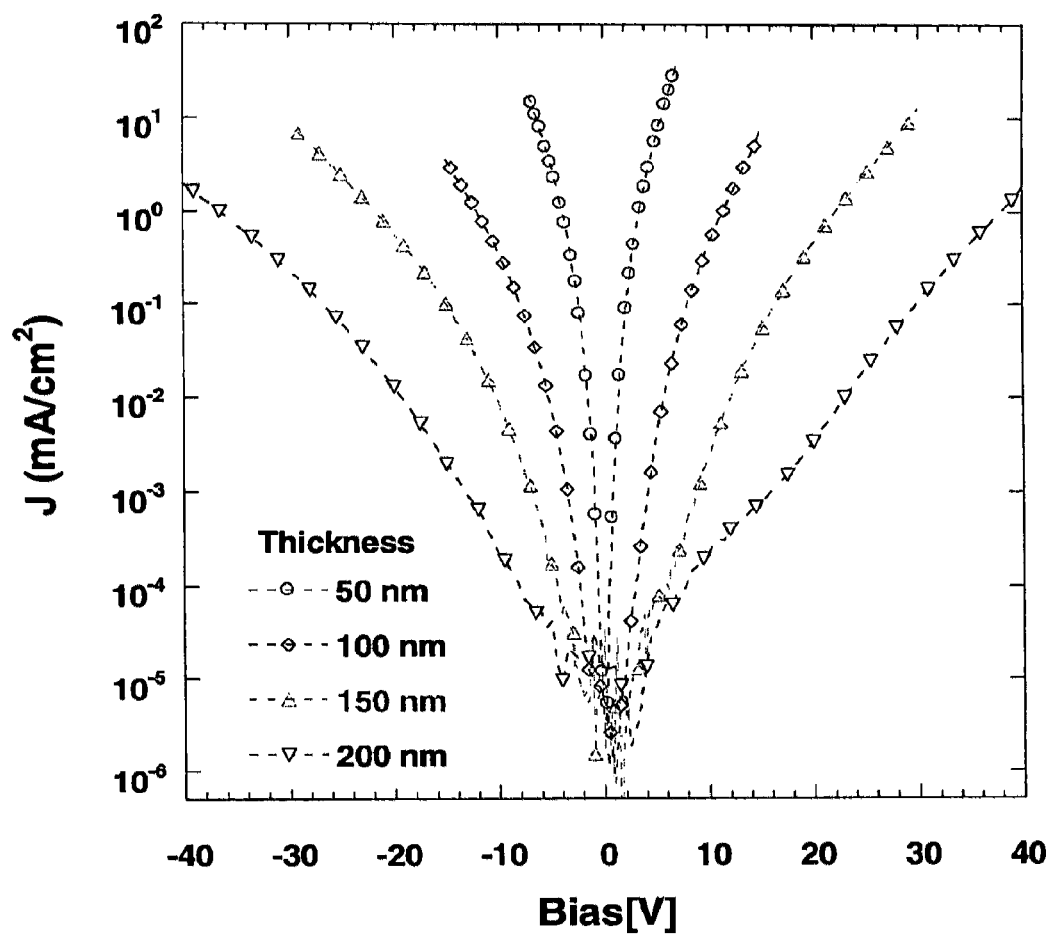
FIG. 4A presents I-V characteristics of $Ta/Ta_2O_{5-\delta}/Al$ MIM diodes with different thicknesses of $Ta_2O_{5-\delta}$.

After cleaning, two different processes were used for post-treatment of the $Ta/Ta_2O_{5-\delta}$ plate. One process was a thermal post-treatment carried out in $H_2$ atmosphere to further improve the quality of the film and to tune the oxygen content in the metal-oxide film. The $H_2$ post-treatment process involved the following steps: loading the $Ta/Ta_2O_5$ plate into a chamber and subjecting the plate to an $H_2$ atmosphere (in a sealed chamber) at a pressure of about 8 Pa, increasing the post-treatment temperature to about 300° C. and then keeping the plates under these conditions for certain periods of time. For example, for 50 nm, 100 nm, 200 nm of $Ta_2O_{5-\delta}$ films, the post-treatment times were about 10 minutes, 20 minutes, and 30 minutes, respectively. After treating the Ta plate in $H_2$ atmosphere at 300° C., the plate was quenched to room temperature as quickly as possible. The data presented in FIG. 4a were obtained with this process.

The second post-treatment thermal process was conducted in air and involved: thermally treating $Ta/Ta_2O_5$ in air at about 300° C. for a period of time. For example, for 50 nm, 100 nm, 200 nm $Ta_2O_5$ films, the anneal times were about 10 minutes, 20 minutes, and 30 minutes, respectively.

The I-V characteristics of $Ta/Ta_2O_5/Al$ devices having $Ta_2O_5$ thermally treated in air were similar to those where $Ta_2O_5$ treatment was performed in $H_2$ atmosphere, but exhibited smaller current density at a given voltage. This result implied that the carrier mobility in $Ta/Ta_2O_5/Al$ devices was sensitive to chemical composition of the oxide film.

While anodization may be performed according to a traditional method employing an acid-containing electrolyte, it was herein determined that superior results are obtain when a salt is used instead of an acid as an electrolyte component. For example, tartrate, citrate or phosphate salts may be used. In a specific example, ammonium tartrate was used. It was discovered that using a salt rather than an acid as an electrolyte component results in $Ta_2O_5$ films which do not require post-treatment under very high temperature conditions. For these films post-treatment temperature that is lower than 300 C, and typically lower than 200 C and, in some cases lower than 100 C is sufficient. This improvement in the MIM diode fabrication method makes possible using plastic substrates with melting or decomposition temperatures lower than 200 or even lower than 100 C. Thus, in some cases, flexible plastic substrates with low melting points may be used.

The process of anodization in ammonium tartrate was similar to that in citric acid except for using 0.01 M ammonium tartrate and different post-treatment of $Ta/Ta_2O_{5-\delta}$.

Figure 4B:
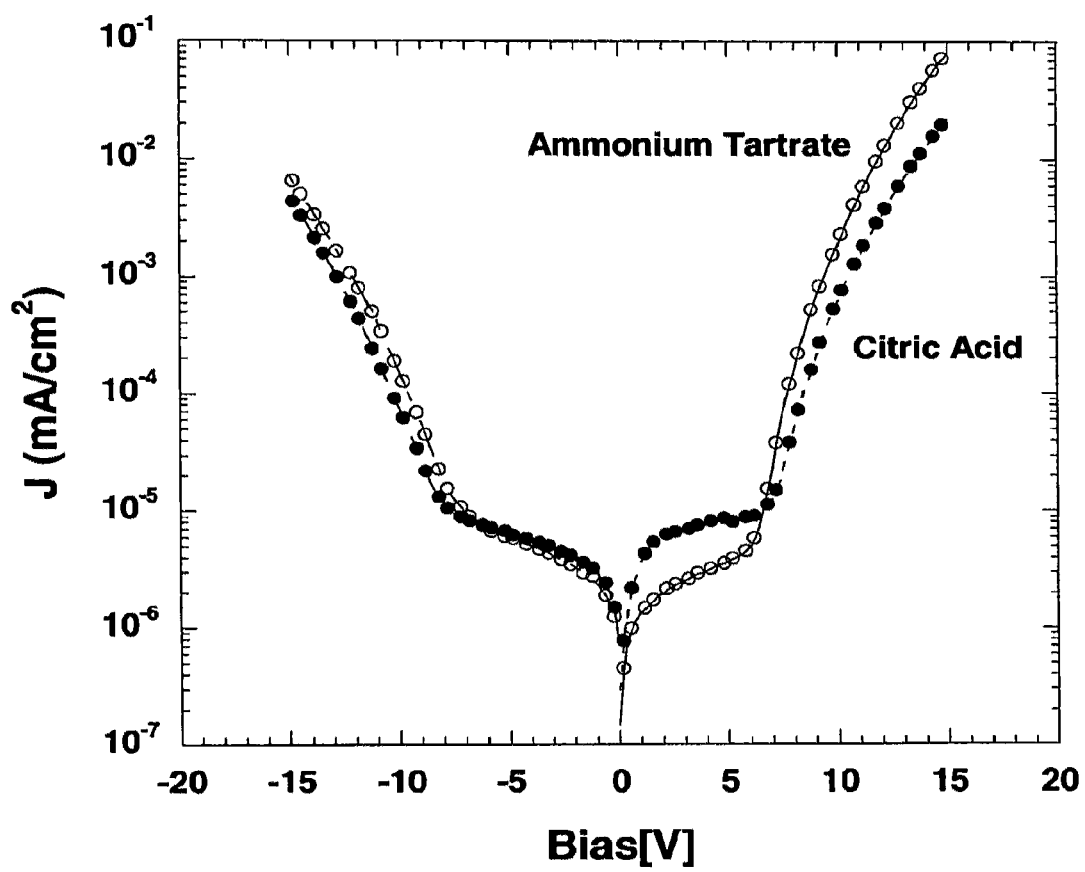
FIG. 4B presents two I-V curves for a $Ta/Ta_2O_{5-\delta}/Al$ MIM diode having ~150 nm thick $Ta_2O_{5-\delta}$ layer formed by anodization of Ta in citric acid solution followed with post-treatment at $H_2$ atmosphere at 300° C. for 30 minutes and for $Ta/Ta_2O_{5-\delta}/Al$ MIM diode having ~150 nm thick $Ta_2O_{5-\delta}$ layer formed by anodization of Ta in ammonium tartrate solution followed with post-treatment in air at 140° C. for 30 minutes.

When anodization was conducted in ammonium tartrate, the thermal treatment of the $Ta/Ta_2O_{5-\delta}$ plate was conducted in air at temperature between 25° C. to slightly less than 200° C. $H_2$ atmosphere was not necessary. The switch ratio [I(+V)/I(V~0V)] and the I-V characteristics of a device thermally treated at 140° C. (as shown in FIG. 4b) were comparable to those for a device thermally treated in $H_2$ atmosphere at 300° C.

Devices having different $Ta_2O_{5-\delta}$ thicknesses, with different annealing temperatures and with different $H_2$ partial pressures were also prepared. Symmetric I-V to biasing polarity were observed in all these cases.

This example demonstrated that symmetric switch characteristics can be achieved in a MIM device with similar work functions in bottom and top metal electrodes This example also demonstrated that the carrier mobility could be optimized with post treatment, or with different anodization process conditions.

Example 2

MIM with Printed Metal Electrodes

A thin gold (Au) stripe (~100 nm thick, ~1 mm wide) was deposited onto a glass substrate. In one example, gold was deposited by electrodeposition. Electrodeposition solution was prepared by dissolving 0.034 g-0.34 g (0.01M-0.1M) of AuCN and 0.0196-0.196 g (0.02-0.2M) of KCN into 15 mL of 0.02-0.2 M KOH aqueous solution. Pulse galvanostatic electrodeposition was carried out using a conventional two-electrode system with Pt wire as a counter electrode. After deposition, the samples were rinsed with DI water and dried by $N_2$ stream.

In another example, gold electrode was formed by electroless deposition. Electroless plating of Au involved reducing $HAuCl_4$ (0.01M) solution with sodium borohydride ($10^{-3}$ mol) in the presence of sodium citrate ($5 \times 10^{-5}$ M in water) as a capping agent.

Figure 5:
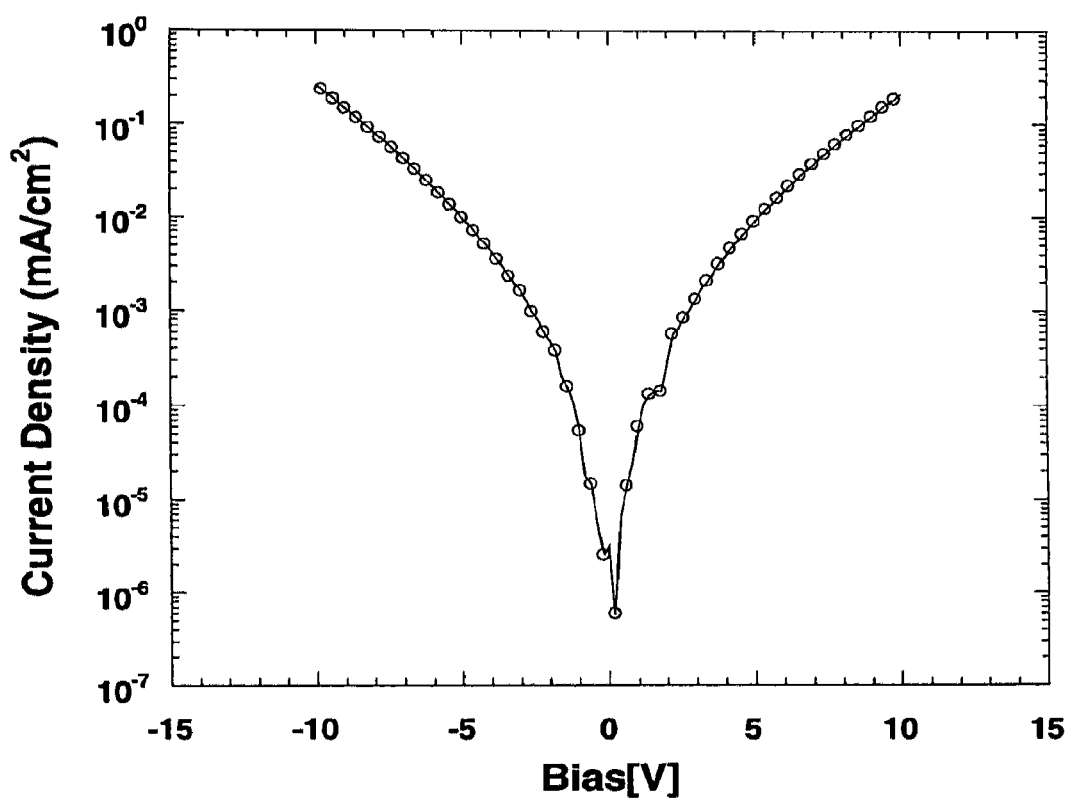
FIG. 5 is a plot of I-V characteristics for an $Au/Ta_2O_{5-\delta}/$PEDOT:PSS-Ag diode

Upon gold deposition, a 100 nm thick Ta film was deposited on top of Au electrode using a DC sputtering PVD apparatus. The Ta layer was converted completely to $Ta_2O_{5-\delta}$ by anodization in ammonium tartrate followed by post-treatment at 140° C. An aqueous solution comprising 2 mL of 3 wt % PEDOT:PSS solution (H. C. Starck, 4083) with 0.5 mL of Ag paste (Nanophase Technology Inc. 6045) in butyl acetate was either spin-cast or drop-cast onto the top of $Ta_2O_{5-\delta}$ layer to form MIM diodes. In the case of spin-casting, the pattern of the top electrode was defined by removing the unwanted electrode material with a Q-tip wetted with DI water. The PEDOT solution dried naturally at room temperature. Baking was carried out at 120° C. for 5-15 minutes to remove the water solvent completely. The I-V characteristic of $Au/Ta_2O_{5-\delta}/PEDOT:PSS-Ag$ diode was shown in FIG. 5.

This experiment was repeated with different $Ta_2O_{5-\delta}$ thicknesses. Symmetric switching characteristics similar to that shown in FIG. 5 were observed.

This example demonstrated that the electrode layer in the MIM device disclosed can be cast or printed with conductive inks.

This example also demonstrated that when the work functions of the top and bottom electrodes are the same or close, symmetric I-V to both polarities could be achieved.

This example also demonstrated that a MIM device can be made without vacuum deposition by using, for example, electroplating or electroless deposition for the bottom electrode.

Example 3

MIM Having an Asymmetrical I-V Characteristic with Top PEDOT Electrode

Figure 6:
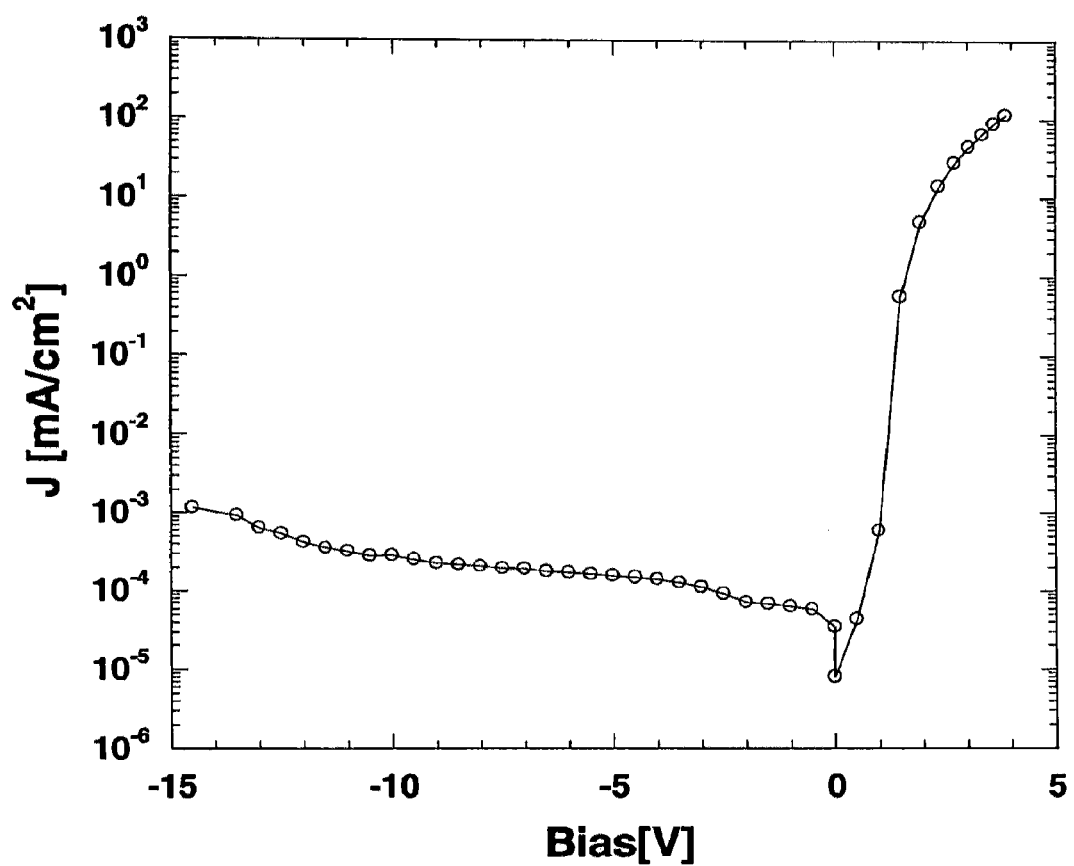
FIG. 6 is a plot of I-V characteristics of $Ta/Ta_2O_{5-\delta}/$PEDOT:PSS diode. Forward bias is defined as higher potential applied to PEDOT:PSS.

Ta metal was sputtered using a DC sputtering apparatus either on glass or on plastic substrates to form a 300 nm thick Ta film. Tantalum film was anodized for 30 minutes and was then subjected to thermal treatment at temperature 140° C. for approximately 30 minutes to form 100 nm thick layer of $Ta_2O_{5-\delta}$. 3 wt % solution of PEDOT:PSS (H. C. Starck, 4083 or PH500) was drop-cast onto top portion of $Ta_2O_{5-\delta}$ to form the MIM diodes. Asymmetric I-V characteristic similar to those observed in a PIN silicon diode was obtained. The I-V characteristic of $Ta/Ta_2O_{5-\delta}/PEDOT:PSS$ is shown in FIG. 6. The rectification ratio (defined as current ratio in both polarities at a given voltage number) at 4V reaches $10^6$. The switch ratio between I(2V) and I(-15V) is $5 \times 10^3$, which is sufficient to drive a display panel made with a EPD film.

This experiment was repeated using thermal anneal temperature of between 25° C. and 180° C. MIM devices with asymmetric I-V characteristics similar to those shown in FIG. 6 were obtained.

This example was repeated with different $Ta_2O_{5-\delta}$ thicknesses ranging between about 30 nm to 200 nm. MIM devices with asymmetric I-V characteristics similar to those shown in FIG. 6 were obtained.

PANI:PSS and $PPY:TiO_2$, PPY:Carbon black (Aldrich), PEDOT:Ag paste conductor inks were also used as the top electrode layer. The work functions of these films vary from 4.5 and 5.2 eV (in contrast to the work function of 4.2 eV in Ta film). Asymmetric I-V characteristics similar to those shown in FIG. 6 were observed.

PEDOT, PANI and PPY based conducting polymers were tailored with the method similar to those described in US Applications 2005/0224788 and 2005/0227082 and in WO application 2005/090434, all of which are herein incorporated by reference. The work functions of such films were reported to be in the range of 5.2-5.8 eV. MIM devices made with such ink for the top electrode show asymmetric I-V characteristics similar to that shown in FIG. 6.

Conducting ink made with conductive carbon nanotubes was also used for the top electrode. Asymmetric I-V characteristics similar to those shown in FIG. 6 were observed.

This example demonstrated that asymmetric I-V behaviors are obtained when the work functions of the top and bottom electrodes are substantially different. The work function of Ta is ~4.2 eV, while that of the top electrode in this example are in range of 4.5 eV-5.8 eV. In addition to traditional applications as switching devices, MIM diodes with asymmetrical I-V characteristics can be used to construct pixel drivers for electrophoretic display applications (U.S. application Ser. No. 11/430,075 by H. C. Lee describing these pixel drivers is herein incorporated by reference in its entirety).

This example also demonstrated that asymmetric MIM devices can be made with at least one of the electrode fabricated by liquid-phase processing.

Example 4

Figure 7:
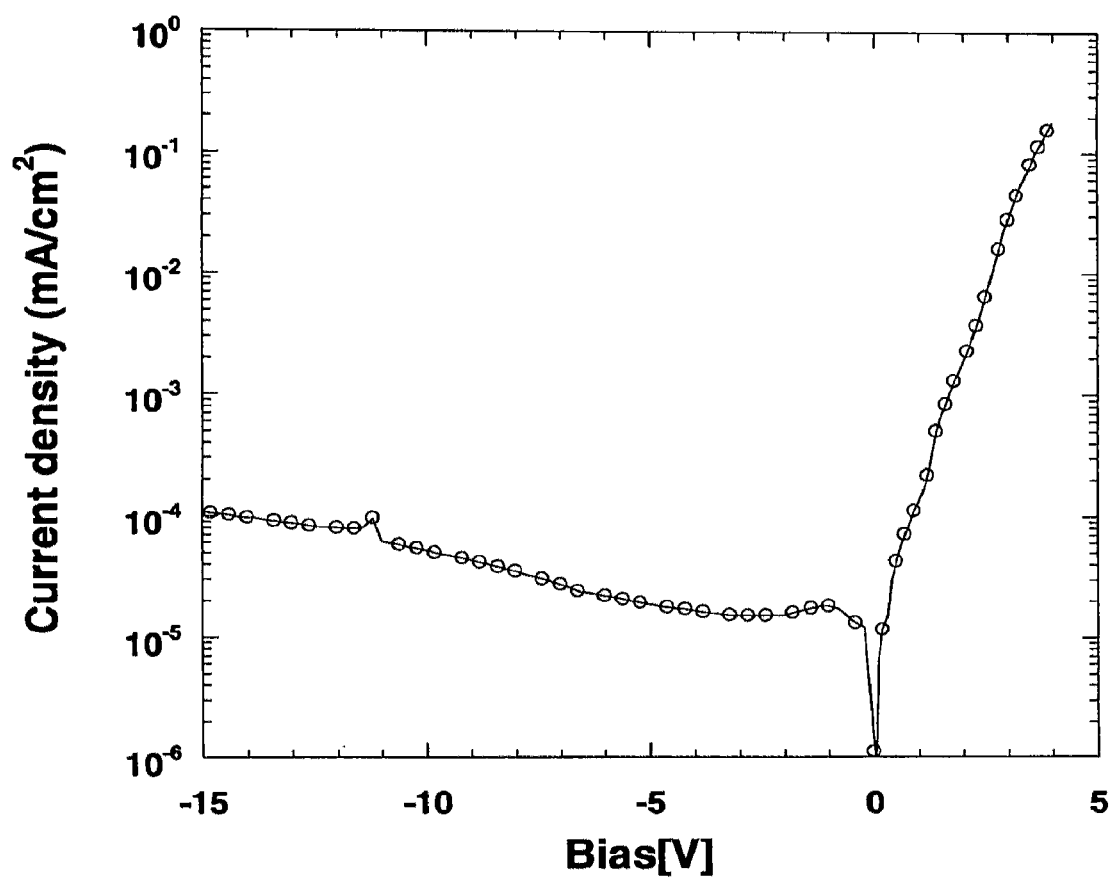
FIG. 7 is a plot of I-V characteristics of $Ta/Ta_2O_{5-\delta}$ (40 nm)/MEH-PPV/Ag. Forward bias is defined as higher potential applied to Ag.

Additional I-Layer or Semiconductor Layer Can be Inserted Between I-Layer and Top Electrode Ta metal was sputtered using a DC sputtering apparatus either on glass or on plastic substrates to form a 300 nm thick Ta film. Tantalum film was anodized for 30 minutes and was then subjected to thermal treatment at temperature 140° C. for approximately 30 minutes to form 100 nm thick layer of $Ta_2O_{5-\delta}$. MEH-PPV powder was dissolved in toluene to form 0.5 wt. % solution. The solution was cast onto top of $Ta_2O_{5-\delta}$ layer and was baked at 80° C. for 30 minutes to remove the solvent completely. The resulting MEH-PPV thickness was ~50 nm. Ag film was used as the top electrode, which was formed by thermal deposition. The resulting Ta/$Ta_2O_{5-\delta}$/MEH-PPV/Ag diode shows asymmetric I-V characteristics, as shown in FIG. 7.

The experiment was repeated by replacing vacuum deposited Ag film with printed Ag paste with a solution dispenser (Asymtek 402). The printed Ag layer was baked at 100° C. for 3 minutes. Asymmetric I-V characteristics similar to those shown in FIG. 7 were observed.

The experiment was repeated by replacing MEH-PPV with poly(9,9-di-n-octyl-2,7-fluorene (PFO), P3HT, polyvinylcarbazole (PVK) and soluble organic molecules such as $C_{60}$ derivatives (e.g., PCBM) and carbon nanotubles. Similar results to those shown in FIG. 7 were observed.

This example, in comparison with the results from Ta/$Ta_2O_{5-\delta}$/PEDOT shown in Example 3, demonstrated that a semiconductor layer can be inserted between I and top electrode to modify the I-V characteristics.

Example 5

MIM with Printed Ag Electrode

Ta metal was sputtered using a DC sputtering apparatus either on glass or on plastic substrates to form a 300 nm thick Ta film. Tantalum film was anodized for 30 minutes and was then subjected to thermal treatment at temperature 140° C. for approximately 30 minutes to form 100 nm thick layer of $Ta_2O_{5-\delta}$. Ag paste as the top metal electrode was drop-cast onto top of $Ta_2O_{5-\delta}$ layer to form MIM diodes (similar to the process in Example 4). The I-V characteristic of Ta/$Ta_2O_{5-\delta}$/Ag similar to those shown in FIGS. 6 and 7 was observed.

This example was repeated with Ag as bottom electrode. The Ag layer was obtained in one example by thermal deposition and in another example by Ag paste deposition. For the case of Ag paste, it was cast through a nozzle to a targeted area and the device was then dried at room temperature. The film was then baked at 100° C. for 30 minutes. The resulting Ag film was between 0.2 to a few microns thick. A thin Ta film was then sputtered with the same process described above. This Ta layer was then fully anodized into $Ta_2O_{5-\delta}$ with the process disclosed earlier. Ag was used as the top electrode and was processed with the same Ag paste and process conditions. Symmetric I-V characteristic similar to that shown in FIG. 4a was observed.

This example was repeated with different metals and conducting metal oxides (such as indium-tin-oxides) as bottom electrodes, with different thickness of $Ta_2O_{5-\delta}$ as the insulator layer. The top electrode was processed with a liquid process with the ink comprising conductive particles whose work function was the same as (or close to) the work function of bottom electrode. Symmetrical I-V characteristics similar to those shown in FIG. 4a were observed.

This example also demonstrated that the metal layers in the MIM diodes can be liquid processed.

This example also demonstrated that the electrodes can be formed without vacuum deposition.

Example 6

Figure 8:
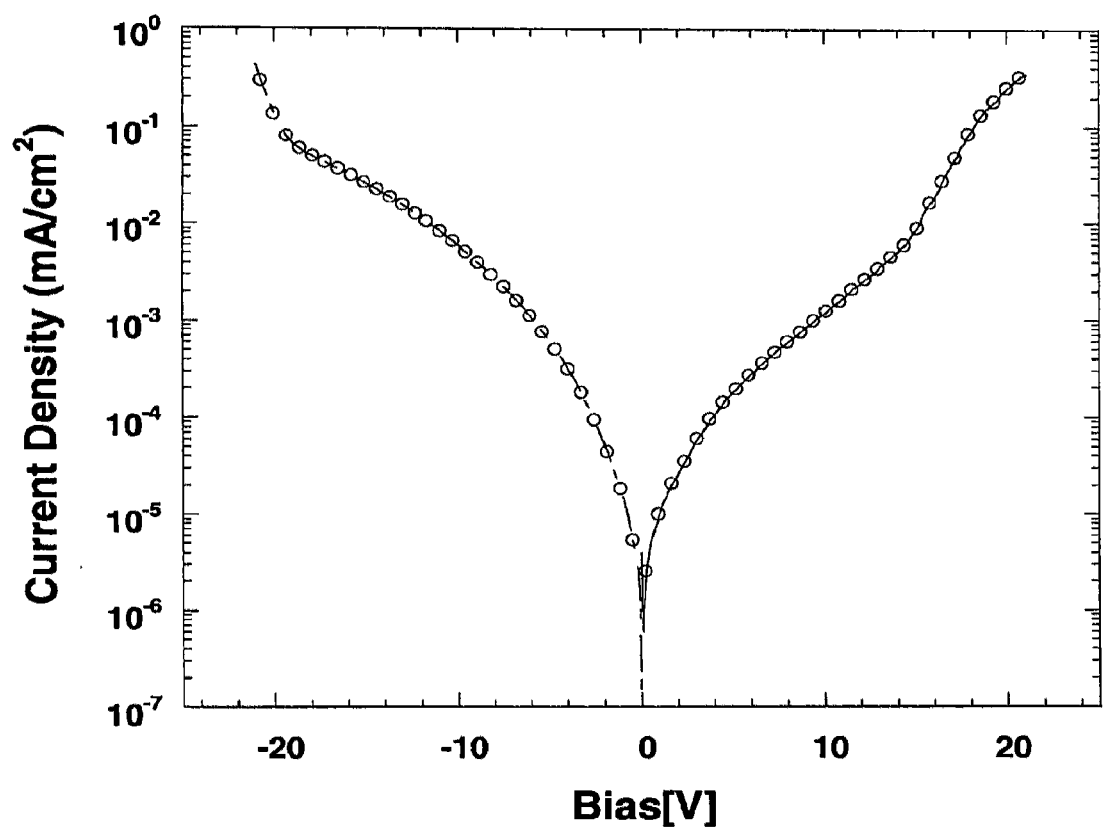
FIG. 8 is a plot of I-V characteristics of $Al/Al_2O_{3-\delta}/Al$ diodes with $Al_2O_{3-\delta}$ formed by anodization.

Example 1 was repeated by replacing Ta with Al. 300 nm of Al was sputtered by a DC sputtering machine (Kurt J. Lesker, Model PVD75) on a glass substrate. 30 nm of $Al_2O_{3-\delta}$ insulator layer was formed by anodizing Al electrode in 0.2 M $H_3BO_3$ solution (pH=~3.5, stainless steel was used as cathode and Al was used as anode). Top electrode aluminum layer having a thickness of 150 nm was thermally deposited onto top of $Al_2O_{3-\delta}$ to form Al/$Al_2O_{3-\delta}$/Al diodes. Symmetrical I-V characteristic of Al/$Al_2O_{3-\delta}$/Al is shown in FIG. 8.

This example demonstrated that symmetric switch characteristics can be achieved in Al/$Al_2O_{3-\delta}$/Al diodes wherein $Al_2O_{3-\delta}$ is formed by anodization in $H_3BO_3$ solution.

Example 7

Al/$Al_2O_3$/Al MIM Diode with $Al_2O_3$ Formed by $O_2$ Plasma

Example 6 was repeated with the insulating layer formed with $O_2$ plasma treatment instead of anodization.

Figure 9:
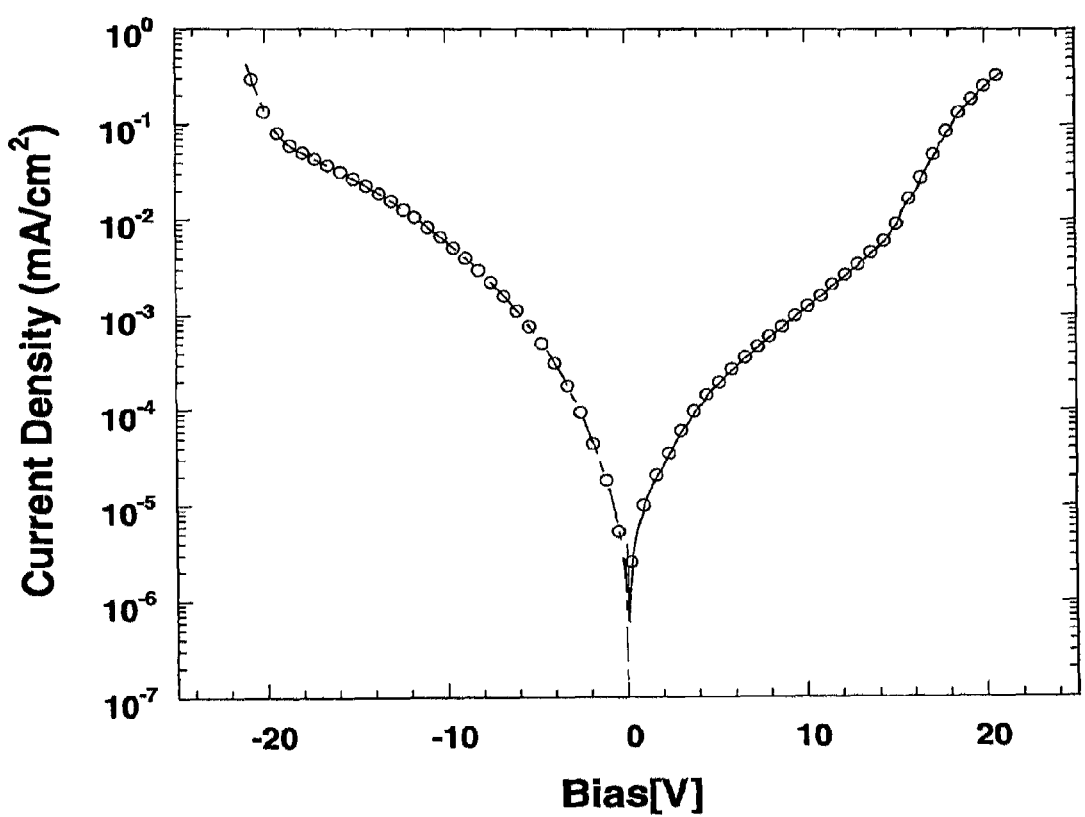
FIG. 9 is a plot of I-V characteristics of $Al/Al_2O_3/Al$ diodes with $Al_2O_3$ formed by $O_2$ plasma treatment.

300 nm of Al was deposited by DC sputtering machine (Kurt J. Lesker, Model PVD75) either on glass substrates or on plastic substrates. A 30 nm of $Al_2O_{3-\delta}$ layer was formed by $O_2$ plasma treatment (Technology PE IIA) with 300 mT/100 W for 30 minutes. Following plasma treatment, about 150 nm of Al was thermally deposited on top of $Al_2O_{3-\delta}$ to form Al/$Al_2O_{3-\delta}$/Al diodes. Symmetrical I-V characteristic was observed as shown in FIG. 9.

This example was repeated with different thickness of $Al_2O_{3-\delta}$ layer as an insulator layer. Symmetrical I-V characteristics were observed.

This experiment demonstrated that the I layer can be formed by $O_2$ plasma treatment of the top layer of the bottom electrode.

Example 8

MIM Diode with I Layer Formed by Thermal Oxidation

Examples 1, 6, and 7 were repeated using thermal oxidation rather than anodization or $O_2$ plasma treatment for formation of an I-layer.

Figure 10:
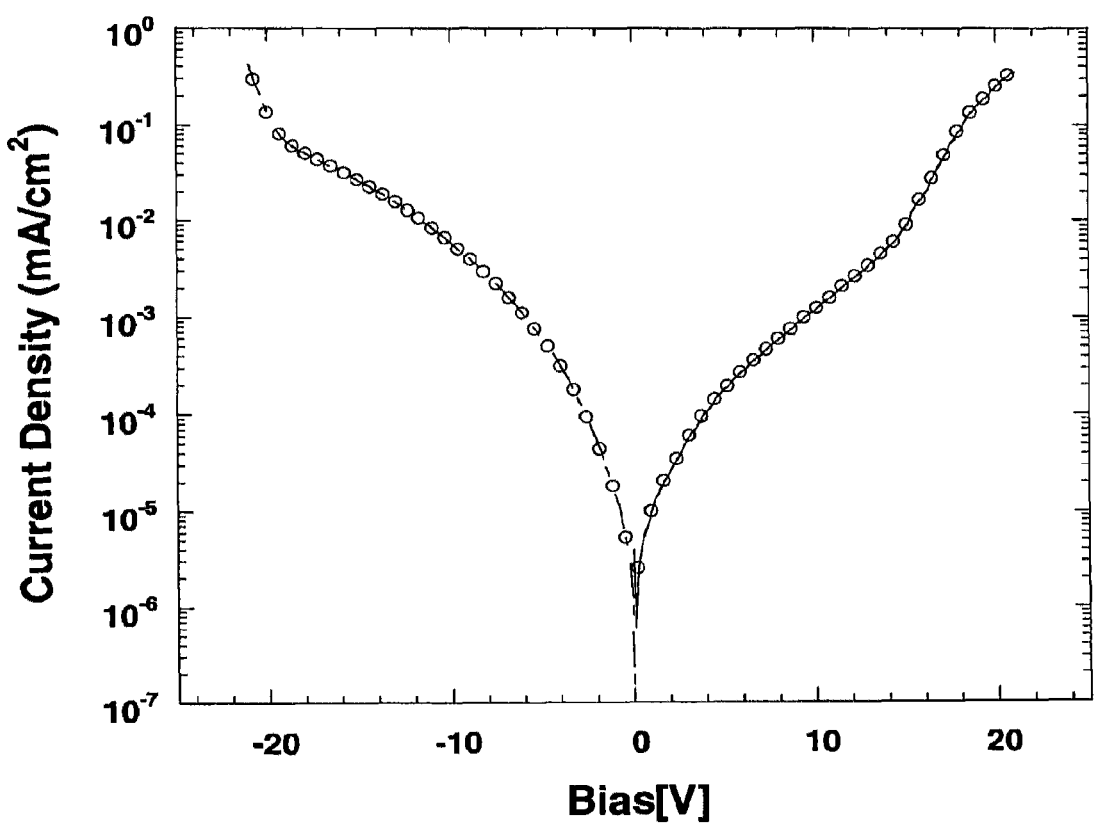
FIG. 10 is a plot of I-V characteristics of Ni/NiO/Au diodes with NiO formed by thermal oxidation performed in the air.

A 300 nm thick layer of Ni was thermally deposited by thermal evaporator (Kurt J. Lesker, Model PVD75). A 30 nm of $NiO_{1-\delta}$ insulator layer was formed by thermal oxidation of Ni in air at a temperature of about 200° C. for 2 hours. 50 nm layer of Au (as a top electrode) was thermally deposited onto top portion of $NiO_{1-\delta}$ to form $Ni/NiO_{1-\delta}/Au$ diodes. Symmetrical I-V characteristic was observed, as shown in FIG. 10.

This experiment was repeated with different thicknesses of $NiO_{1-\delta}$ layers. Symmetrical I-V characteristics were observed.

This experiment was repeated with a 100 nm thick, thermally deposited Ni layer as the top electrode. Symmetrical I-V characteristics similar to those shown in FIG. 10 were observed.

This example demonstrated that the I layer in MIM can be formed by thermal oxidation of the top surface of the bottom electrode.

Example 9

MIM Diode with an I Layer Formed by Thermal Oxidation

Example 8 was repeated with Ti foil instead of Ni as bottom electrode.

Figure 11:
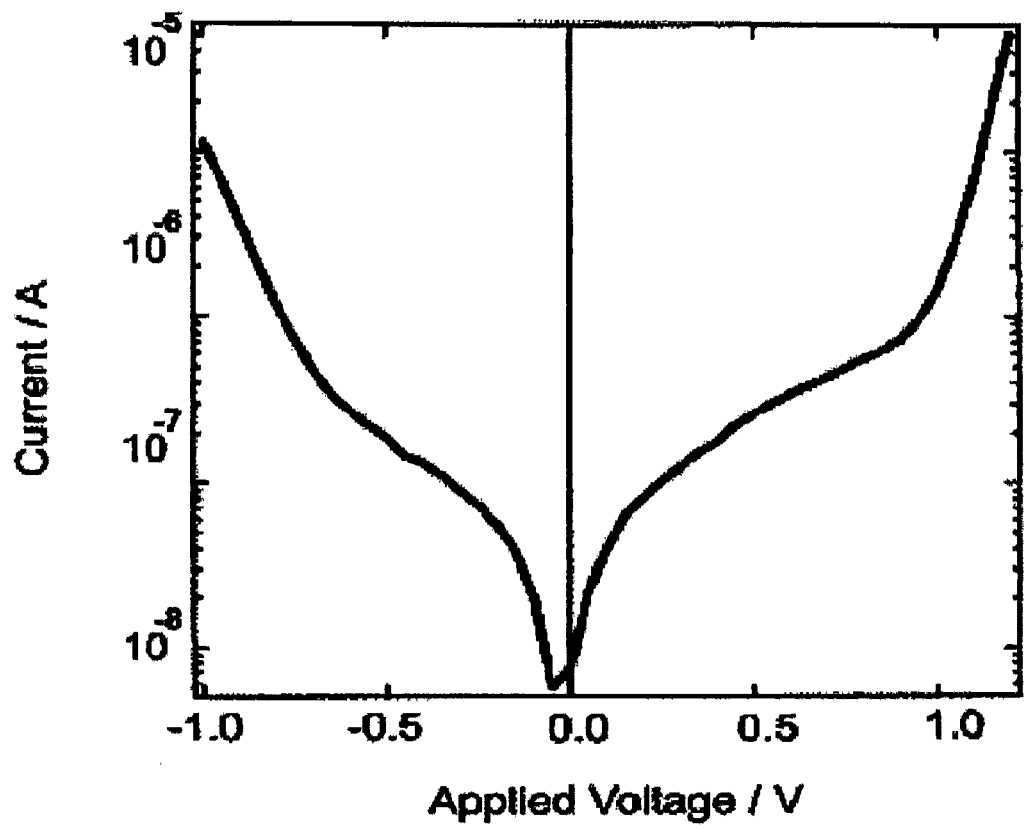
FIG. 11 is a plot of I-V characteristics of $Ti/TiO_2/Au$ diodes with $TiO_2$ formed by thermal oxidation in the atmosphere.

Ti foil was used as the bottom electrode. A 20 nm thick layer of $TiO_{2-\delta}$ was formed by thermal oxidation of Ti in air at a temperature of 500° C. for 6 hours. Gold top electrode was vapor deposited on top of $TiO_{2-\delta}$ I-layer to form $Ti/TiO_{2-\delta}/Au$ diodes. Asymmetrical I-V characteristics were observed, as shown in FIG. 11.

This example was repeated by replacing Au with thermally deposited Ti and Al to form either $Ti/TiO_{2-\delta}/Ti$ or $Ti/TiO_{2-\delta}/Al$ MIM diodes Asymmetrical I-V characteristics similar to those shown in FIG. 8 were observed.

This example further demonstrated that the I layer in a MIM device can be formed by thermal oxidation of top surface of the bottom electrode.

Example 10

MIM Diode with an I Layer Formed by Room Temperature Chemical Treatment

A 100 nm thick ITO first electrode layer was formed either on glass or on PET substrate by DC sputtering machine. A thin sacrificial layer of $Ti(OPr^i_4)$ (Aldrich) was deposited onto the top portion of ITO electrode to a thickness of 50 nm by spin-cast method from methanol solution. $H_2S$ or $CS_2$ gas was then directed to the surface of $Ti(OPr^i_4)$, completely converting a layer of $Ti(OPr^i_4)$ to $TiS_2$. Another metal with a different or similar work function was thermally deposited to form diode structures with asymmetrical and symmetrical I-V characteristics. Au, ITO, PEDOT, Ag, Ni, when deposited as top electrode afforded MIM devices with symmetrical I-V characteristics, while Al, Yb, Zn, Mn, and Ba, when used as top electrodes afforded MIM devices with asymmetrical I-V profiles

Example 11

Process Methods for Printing Electrodes

Examples 2 and 3 were repeated, but with the top electrode formed with PEDOT solution printed with a solution dispenser (Asymteck 402, Nozzle contact to substrate directly or through the solution). The viscosity of PEDOT was tailored to be in the range of 10-50 cP. With a needle nozzle (Gauge 32, ~90 um inner orifice) conducting dots and lines of ~0.2 mm in width and a few thousand Angstrom in thickness were achieved. Symmetric I-V characteristics similar to those shown in FIG. 5 were observed.

This experiment was repeated with the PEDOT layer printed with an Ink-jet printer (Microfab, Jetlab-4), The viscosity of PEDOT was tailored to 5-15 cP by dilution with water for fitting the printing process. The inkjet printing belongs to non-contact printing technique. In such printing process, the solution jet nozzle forms round drops before landing on the substrate. The substrate was 0.75-1 mm away from the nozzle head. With a nozzle of 30 um orifice, conducting lines and dots of 50-120 microns were formed on substrates with different hydrophilic properties. Devices made with such process were used to fabricate pixel drivers for EPD display (see examples below)

Dip-coating was also used for forming the conductive layers in MIM devices. The pattern was formed by treating the substrate with a photomask and a UV light source similar to that used in display industry. In addition to dip-coating, slot-coating, bar-coating and spray coating can also be used. The viscosity of the ink used for such processes is similar to that used for dispensing, e.g., solutions with viscosity of 5-50 cP have been tested.

Thermal transfer can also be used for making the conductive layers in MIM devices. In this process, the conductive film was thermally transferred in solid form from a mother sheet to the targeting areas on the substrate. Laser-scanner was used as the thermal source.

Silk-screen printing has also been used for forming the Ag layer and the organic conductor layers. In this process, the viscosity of the ink was tailored to in range of 5,000-20,000 cP. Commercial screen printer was used with a mask. 300 mask screen was taken.

Similar to dispensing, offset printing, gravure printing, flexo printing can also be used. The ink properties are common to all these processes.

This example demonstrated that all types of printing tools known to experts in printing industry can be used for patterning conducting inks during liquid phase processing.

Example 12

Operational Life-Time for MIM Symmetrical Diodes

Figure 12:
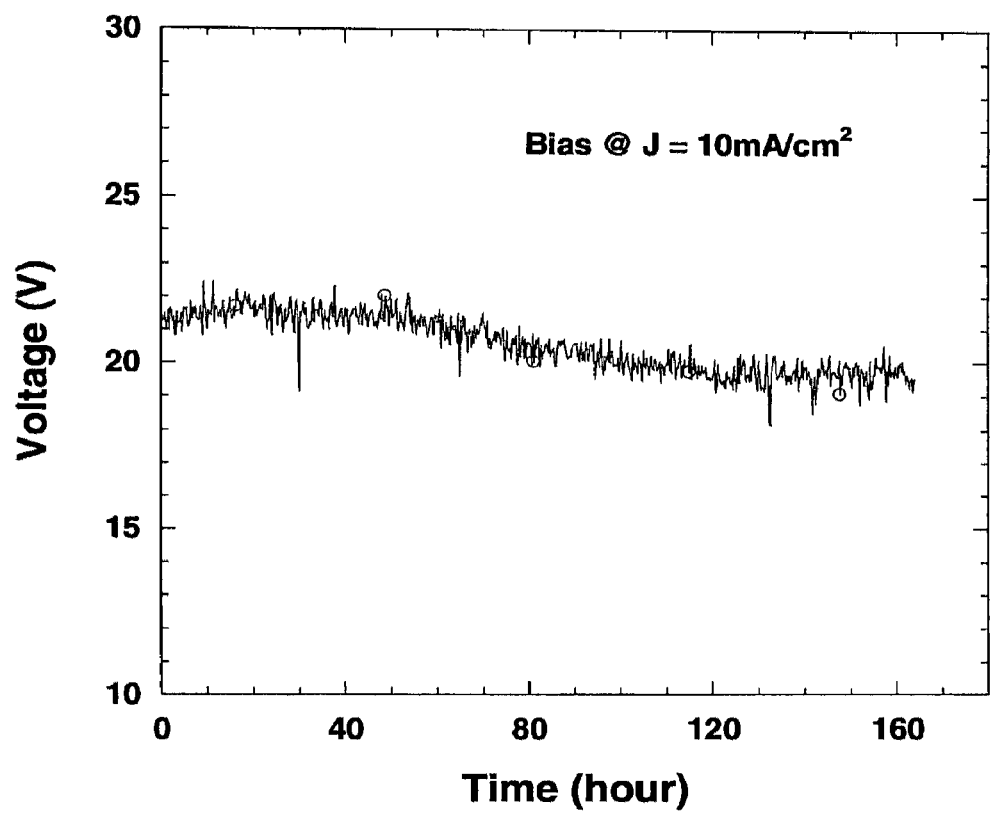
FIG. 12 is the operational life-time of $Ta/Ta_2O_{5-\delta}/Al$ diode with thickness of $Ta_2O_{5-\delta}$ around 100 nm.

Operational life-time of MIM devices was measured at room temperature at given current levels. FIG. 12 shows a data set for a $Ta/Ta_2O_{5-\delta}/Al$ device at 10 $mA/cm^2$. After 120 hours, the voltage remains at the same level without noticeable degradation of electrical properties of the device.

This experiment was repeated by replacing Ta by Al as bottom electrode and $Ta_2O_{5-\delta}$ by $Al_2O_{3-\delta}$ as insulator. Results similar to those shown in FIG. 12 were observed.

In a commercial active matrix liquid crystal display, the pixel switch is only switched on 1/200-1/1000 of total operation time. This translates to continued operation of the pixel switch for ~44-220 hours. The results in this example demonstrated that MIM devices with printed top electrode are sufficiently stable for commercial applications.

Example 13

Shelf-Stability of MIM with PEDOT Layer

Figure 13:
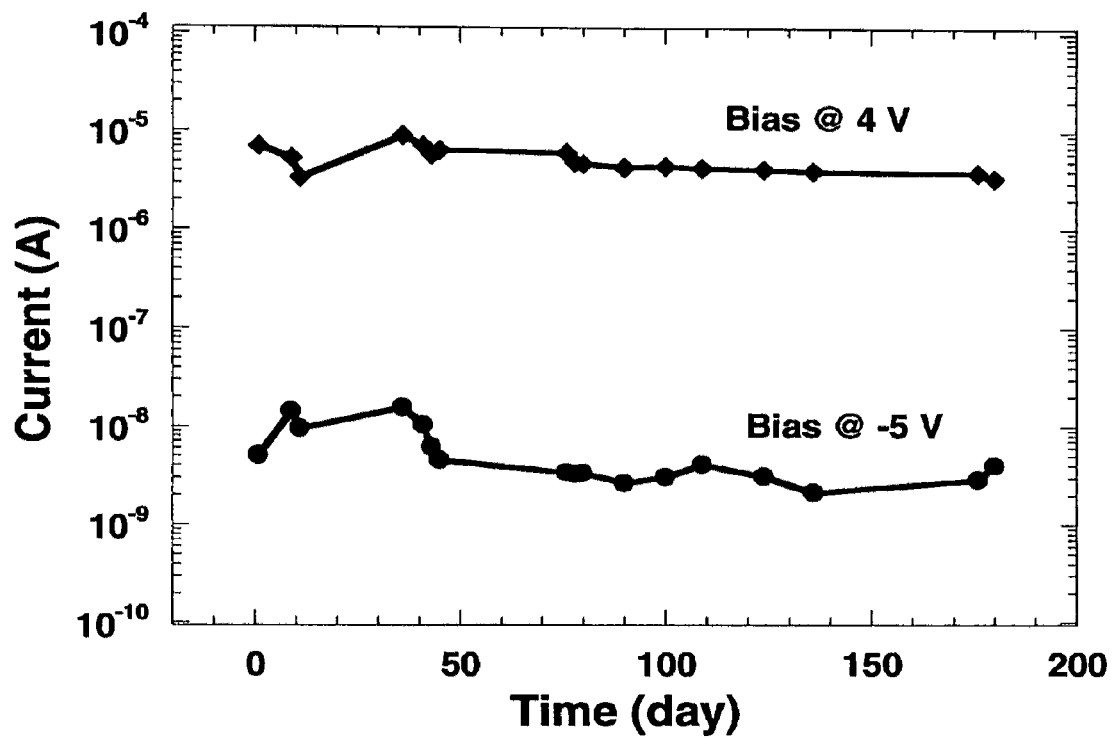
FIG. 13 is a plot illustrating shelf-stability of $Ta/Ta_2O_{5-\delta}/$PEDOT:PSS MIM diode with a 100 nm thick $Ta_2O_{5-\delta}$ layer.

Measurements of shelf-stability of MIM diodes were conducted. FIG. 13 shows shelf-stability of a MIM diode with a structure of Ta/Ta$_2$O$_{5-\delta}$/PEDOT:PSS in a non-encapsulated form. It is shown clearly that both forward and reverse currents only drop 10% after 180 days. However, the switch ratio (I(4V)/I(-5V)) remains without noticeable change after testing for 4320 hours.

This example was repeated by replacement of PEDOT:PSS by Al as top electrode to form Ta/Ta$_2$O$_{5-\delta}$/Al MIM diode. A similar result to that shown in FIG. 13 was observed.

This example was repeated for a MIM device with Ta replaced by Al, and Ta$_2$O$_{5-\delta}$ replaced by Al$_2$O$_{3-\delta}$ to form Al/Al$_2$O$_{3-\delta}$/Al MIM diode. Similar results were observed.

This example was repeated by replacement of Ta by Au as bottom electrode and either Ta$_2$O$_{5-\delta}$ or Al$_2$O$_{3-\delta}$ as the insulator layer and printed PEDOT:PSS as top electrode. The results similar to that shown in FIG. 13 were observed.

This experiment demonstrated that non-encapsulated MIM diodes with printed top electrode have long shelf life. Integrating such device into an active matrix display will have sufficient shelf-life for practical application due to additional package provided during integration.

Example 14

Storage Lifetime

Figure 14:
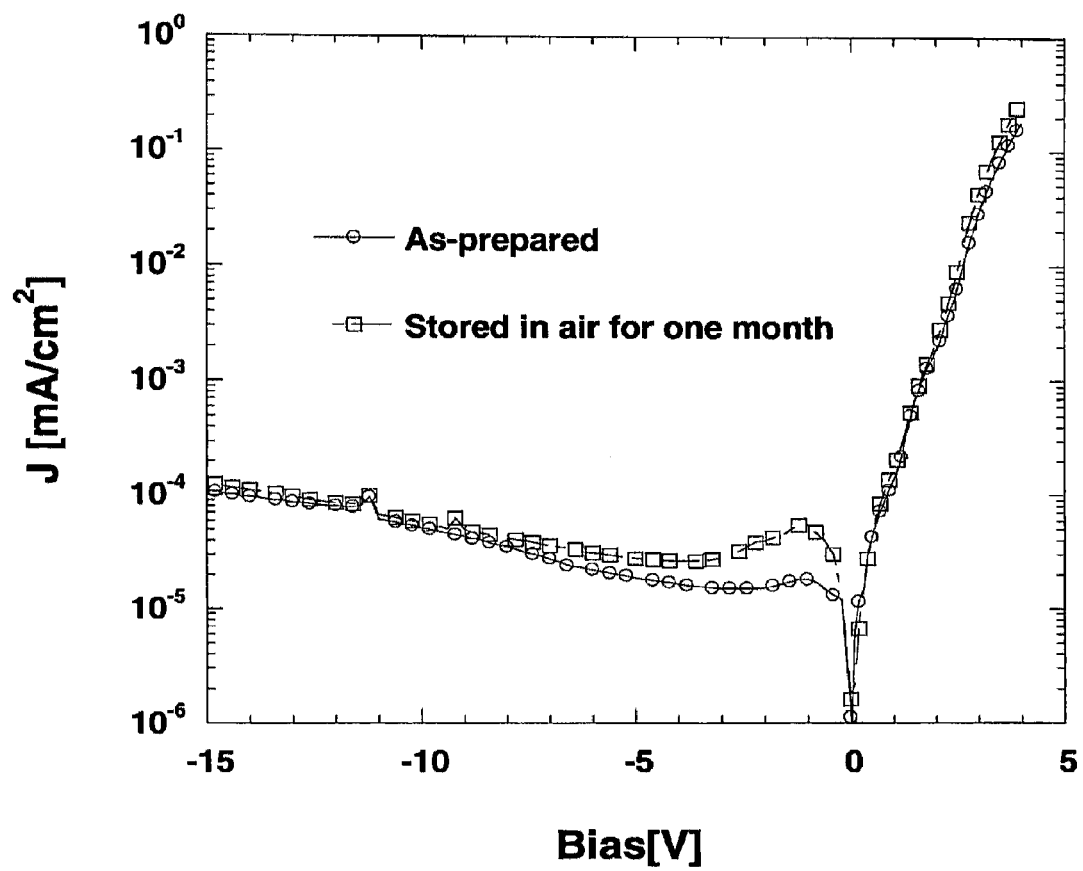
FIG. 14 is a plot of the I-V characteristics of $Ta/Ta_2O_{5-\delta}$ (40 nm)/MEH-PPV/Ag diode as prepared and after storage in air for one month. Forward bias is defined as higher potential applied to Ag.

The I-V characteristics of un-encapsulated MIM diodes were also investigated over storage time. FIG. 14 presents the I-V characteristics for a diode with a structure of Ta/Ta$_2$O$_{5-\delta}$/MEH-PPV/Ag as prepared and stored in air for one month. No noticeable I-V characteristic change was observed in this device during test period.

This example was repeated by replacement of Ta by Al as bottom electrode and Ta$_2$O$_{5-\delta}$ by Al$_2$O$_{3-\delta}$ as insulator. Similar results to those shown in FIG. 8 were observed.

Figure 15:
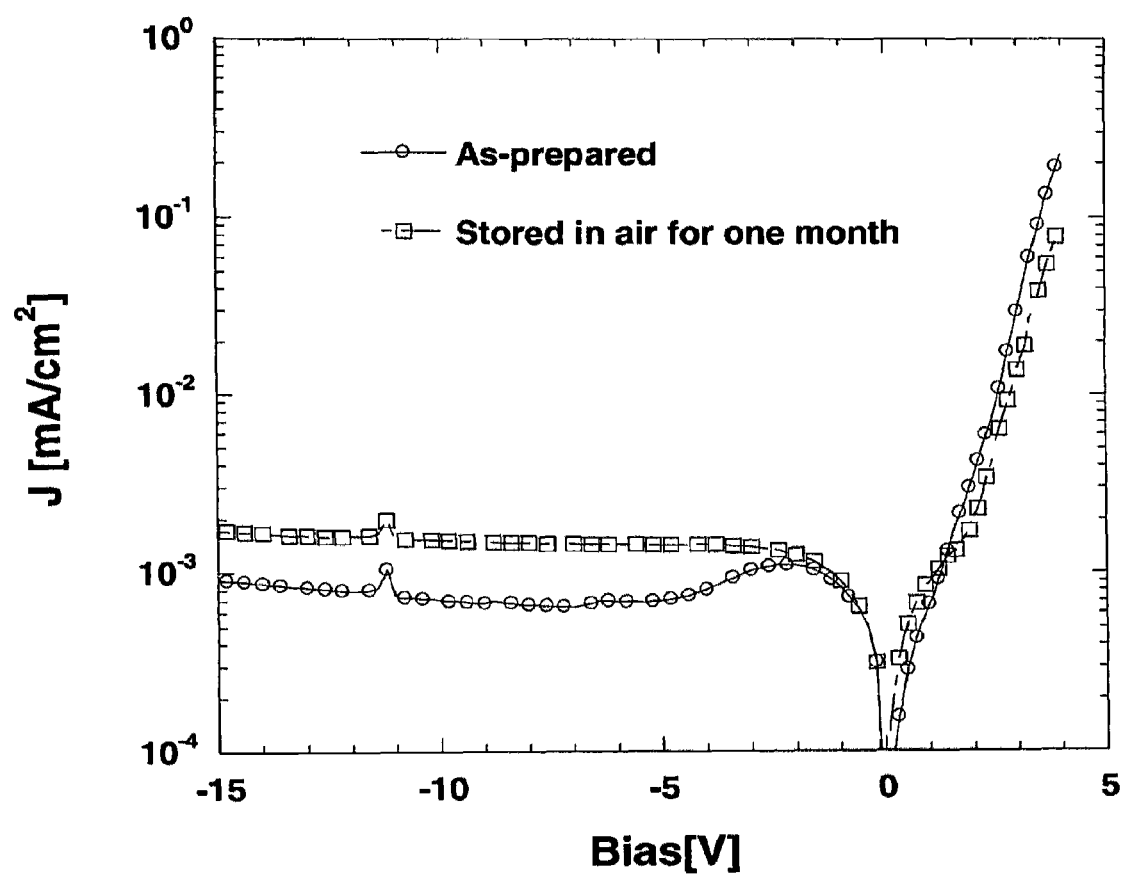
FIG. 15 is a plot of the I-V characteristics of $Ta/Ta_2O_{5-\delta}$ (40 nm)/$P_3HT$/Ag diode as prepared and after storage in air for one month.

FIG. 15 presents I-V characteristics of a MIM diode with a structure of Ta/Ta$_2$O$_{5-\delta}$/P3HT/Ag as prepared and stored in air for one month. Again, No noticeable I-V characteristic was observed in this device during the test period.

This measurement was repeated for diodes prepared by replacement of Ta by Al as bottom electrode and Ta$_2$O$_{5-\delta}$ by Al$_2$O$_{3-\delta}$ as insulator. Similar results to those shown in FIG. 15 were observed.

This measurement was also repeated for Ta/Ta$_2$O$_{5-\delta}$/Al and/or Al/Al$_2$O$_{3-\delta}$/Al as MIM diodes. Similar results were observed for storage life times of these diodes.

This experiment demonstrated that MIM devices with printed top electrode have long storage life even in unencapsulated condition. These devices allowed commercial applications with low cost substrates and packaging.

Example 15

Using MIM Switch to Drive a Display Front Panel

Figure 16:
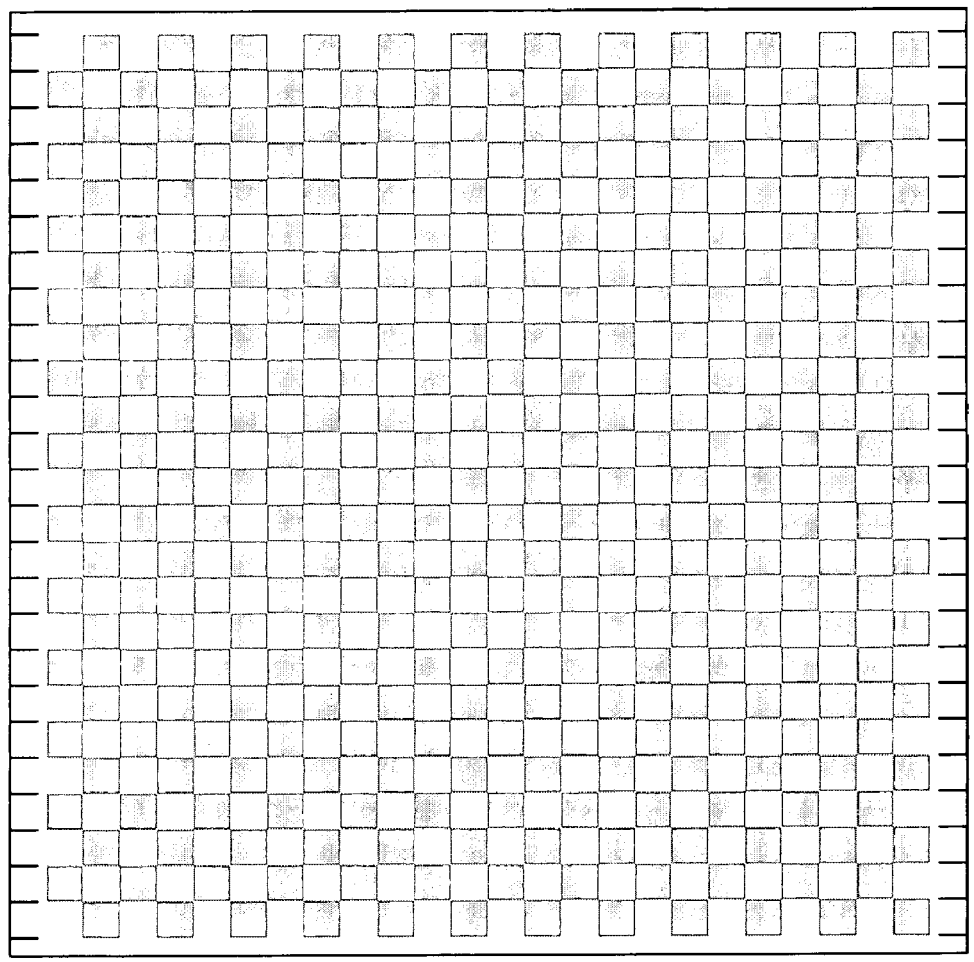
FIG. 16 is a graphical representation of a checkerboard pattern obtained with an active matrix electrophoretic display (AM-EPD) fabricated according to certain embodiments of present invention.

Ta/Ta$_2$O$_{5-\delta}$/PEDOT diodes were used to construct pixel drivers for a display. The display comprised 24 columns and 24 rows. The pitch size of each display element was 2 mm×2 mm (12.5 dot-per-inch format). Electrophoretic display (EPD) film purchased from Sipix Image Inc., Fremont, California was used for display elements. The reflectivity of such EPD films can be changed by application of a certain level of external voltage to its front and back electrode. The reflectivity, when changed, can hold after the external bias is withdrawn. By applying a forward 15 V bias for 0.5-1.5 seconds, the EPD film turns to white color with a reflection of ~30%. Under bias of −15 V applied for ~1-4 seconds, the EPD films turns to deep green color with light reflection of less than 3%. At voltage bias of less than 2 V bias, the EPD film retains the color previous recorded. Asymmetric MIM diodes disclosed in this invention were used to drive the EPD front plate. The circuit for driving each EPD pixel comprised a selection line, a data line, a switch diode and a resistor in serial to form a voltage divider. The pixel electrode and the corresponding driving scheme were disclosed in U.S. application Ser. No. 11/430,075 by H.-C. Lee et al. which is herein incorporated by reference for all purposes. The EPD pixel was connected to the anode of the switch diode and to one side of the resistor. The switch device structural parameters, process conditions and performance parameters were similar to those disclosed in the Example 3. The thicknesses of Ta and Ta$_2$O$_{5-\delta}$ were 300 nm and 30 nm respectively. The anode was printed with a solution dispenser (Asymtek 402), and the ink was PEDOT:PSS purchased from Bayer, product code 4083 and was re-formulated to proper viscosity for the printing tool. After the active-matrix backplane (the plane comprising a matrix of the pixel drivers in the same format of 24×24 matrix) was made with the top most layer in the form of 24×24 pixel electrode to contact the EPD front panel, the EPD film was laminated with the free-surface side in contact with the pixel electrodes on the backplate, and with proper pressure (~2 ld/cm$^2$) at 80-100° C. A graphical representation of check board pattern created with the AMEPD display is shown in FIG. 16. Such MIM based Active matrix EPD display can be operated at a voltage range of 10-18 V that commercial CMOS drivers can be used as peripheral row drivers and column drivers outside the display area.

This example demonstrated that the MIM switches disclosed in this invention can be used to construct pixel drivers for displays.

Example 16

MIM switch Devices with Low Capacitance

Impedance analysis was carried out with one of the devices shown in Example 4. The device structure was Ta/Ta$_2$O$_{5-\delta}$/MEH-PPV/PEDOT in which MEH-PPV and PEDOT layers were printed with a solution dispenser (Asymtek 402). The thicknesses of each of the four layers were 300 nm, 30 nm, 100 nm and 300 nm respectively. The size of the testing device was defined by the overlaying area of the Ta and PEDOT electrode, and was ~0.57 mm by 3.5 mm (~0.02 cm$^2$). The capacitance of this device is, ~0.8 nF, nearly independent of voltage in range of −15 and +5V range. In comparison, capacitance of a switch made without the MEHPPV layer (similar to that disclosed in Example 3) was also measured, and ~20 nF was obtained for device with the same area.

This example demonstrated that by inserting a semiconductor layer with low dielectric constant (the dielectric constant of MEHPPV is ~2.6 vs 24-27 in Ta$_2$O$_{5-\delta}$), the capacitance of the switch device can be reduced substantially. In fact, in this example, the capacitance of the switch is mainly determined by the low-k dielectric layer in between the two electrodes. Low capacitance in the switch device allows the display to be driven faster and the voltage on front display element to be holding longer (which translates to more display rows that can be allowed to add in); i.e., improving the display performance. These effects are general to all displays including EPD and LCDs.

Although various details have been omitted for clarity's sake, various design alternatives may be implemented. Therefore, the present examples are to be considered as illustrative and not restrictive, and the invention is not to be limited to the details given herein, but may be modified within the scope of the appended claims Example 17

MIM Switch Devices with Surface-Modified I-Layer

A number of device structures with surface-modified I-layer were formed. Fabrication of Ta/Ta$_2$O$_{5-\delta}$/alkylsilane/Au; Ta/Ta$_2$O$_{5-\delta}$/alkylsilane/Ag; and Ta/Ta$_2$O$_{5-\delta}$/alkylsilane/PEDOT will be described.

Tantalum film having a thickness of 150 nm was sputter-deposited on a substrate at room temperature. The film was patterned to define individual devices using a standard photolithographic process.

After the pattern was formed, the top portion of the tantalum film was converted to Ta$_2$O$_{5-\delta}$ by anodization process, as previously described. The layer of Ta$_2$O$_{5-\delta}$ had a thickness of about 30 nm.

The tantalum oxide surface was then subjected to cleaning in order to remove remaining organic material. In some cases, cleaning was performed by UV irradiation and ozone exposure. In other cases, cleaning was accomplished by plasma oxygen treatment.

After cleaning was completed, the surface was modified by depositing a thin layer (having about monomolecular thickness) of an organosilicon compound which is capable of reacting with residual water and/or —OH residues on the surface of the oxide layer. In a particular example, tridecafluoro-1,1,2,2-tetrahydrooctyl)trichlorosilane CF$_3$(CF$_2$)$_5$CH$_2$CH$_2$SiCl$_3$ was used, which is available from Gelest Inc of Morrisville, Pa. under catalog number SIT8174.0. The organosilicon compound was deposited in some examples by vapor priming, which involved exposing the substrate to the vapor of the organosilicon priming agent, and allowing the vapor to react with and thus modify the substrate surface. In other cases the organosilicon compound was deposited by dip- or spin-coating. In some cases, when coating method was used, solvent was completely removed from the substrate surface by post-treatment heating of substrate to 110° C. for 10-30 minutes.

In the next operation, anode material was deposited by a liquid-phase method onto the modified surface of the oxide layer. In one example, silver nanoparticles were deposited in a pattern using inkjet printing, forming Ta/Ta$_2$O$_{5-\delta}$/alkylsilane/Ag device. A Fuji Dimatix 2800 inkjet printer was used to print silver anode. The device size was controlled by the overlap of the anode and cathode electrodes. The cathode Ta line widths of 10 µm and greater were obtained. The anode dot sizes of 25 µm were obtained using ink-jet printing. Devices having sizes of about 2.5·10$^{-6}$ cm$^2$ and greater were obtained. Analogously, in a different example, an ink containing gold nanoparticles was printed onto the modified surface of the tantalum oxide to form Ta/Ta$_2$O$_{5-\delta}$/alkylsilane/Au device. Inkjet printing was used and devices having similar sizes as described for silver anode were obtained. After the nanoparticles were deposited, the devices were subjected to thermal post-treatment. The device was heated to a temperature of 160° C. for 30 minutes, in the case of a device with silver anode. Exposure to a temperature of 250° C. for 30 minutes was used for a device with gold anode. In yet another example, Ta/Ta$_2$O$_{5-\delta}$/alkylsilane/PEDOT device was fabricated by printing a PEDOT-containing ink (available from H. C. Starck) onto an organosilane-modified metal oxide surface. Inkjet printing was used to deposit PEDOT.

Figure 17:
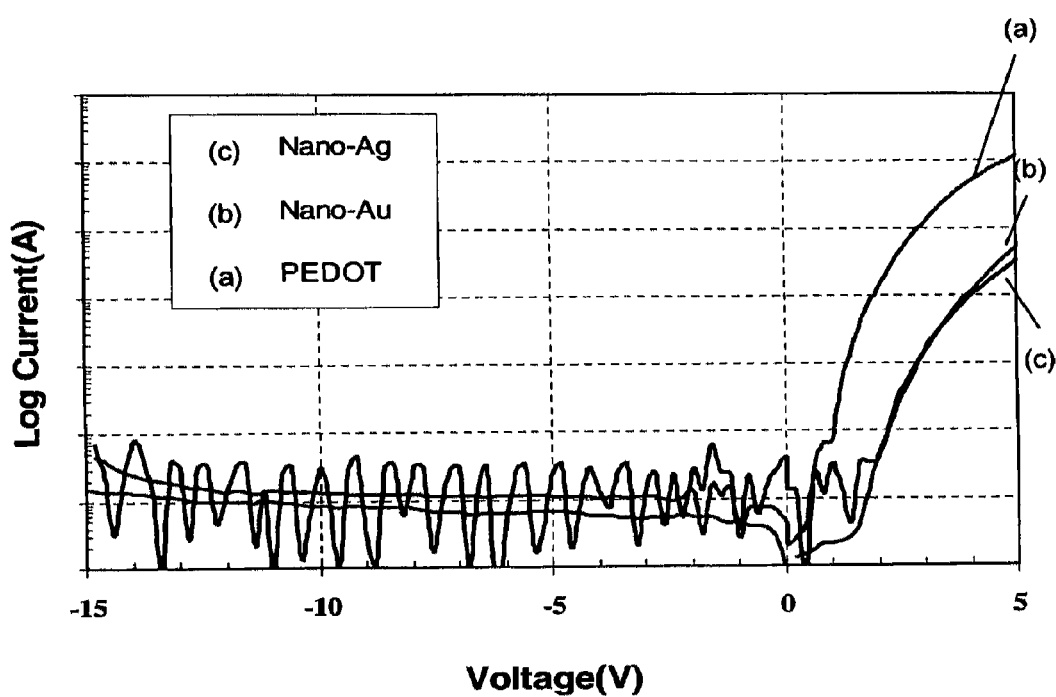
FIG. 17 is a plot of I-V characteristics of $Ta/Ta_2O_{5-\delta}/$organosilane/PEDOT, $Ta/Ta_2O_{5-\delta}/$organosilane/Au, and $Ta/Ta_2O_{5-\delta}/$organosilane/Ag diodes illustrated by curves (a), (b), and (c) respectively.

With all three anodes described in this example, the current-voltage characteristics scaled well with the size of the device. FIG. 17 illustrates current-voltage characteristics for Ta/Ta$_2$O$_{5-\delta}$/alkylsilane/PEDOT (curve a), Ta/Ta$_2$O$_{5-\delta}$/alkylsilane/Au (curve b), and Ta/Ta$_2$O$_{5-\delta}$/alkylsilane/Ag (curve c) devices. The size of the test devices was about 4·10$^{-6}$ cm$^2$. The data indicate that monopolar switching behavior was observed in diodes with a monomolecular organosilane layer for all three devices, that is, devices with a conducting polymer anode and with metal nanoparticle inks. Switch ratio, measured as current ratio I(5V)/I(−15)V of greater than about 10$^3$ was observed for all three devices. Switch ratio of about 3·10$^3$ was observed for diodes with Au and Ag anodes, and switch ratio of about 10$^5$ was observed for the diode with the PEDOT anode. The threshold voltage for forward current turn-on in Ag and Au-containing diodes is about 1.6 V, and is different from that in a diode with the PEDOT anode.

What is claimed is:

1. A method of forming a vertical two-terminal switching device comprising:
   (a) forming a first electrode of the vertical two-terminal switching device on a substrate, wherein the first electrode comprises a metal layer being characterized by a first work function value;
   (b) forming a layer of an inorganic insulator or broad band semiconductor, over at least a portion of the first electrode, wherein forming the layer of the inorganic insulator or broad band semiconductor comprises anodizing, thermally oxidizing or plasma oxidizing at least a portion of the metal layer; and
   (c) forming a second electrode by forming a layer of a second conductive material overlaying at least a portion of the layer of an inorganic insulator or broad band semiconductor and residing over at least a portion of the first electrode, wherein the second conductive material is characterized by a second work function value, and wherein forming the second electrode comprises depositing a liquid-phase material.

2. The method of claim 1, wherein forming the first electrode comprises forming the layer of metal by a method selected from a group consisting of physical vapor deposition (PVD), chemical vapor deposition (CVD), plasma-enhanced chemical vapor deposition (PECVD), and photo-organic deposition method (PODM).

3. The method of claim 1, wherein forming the first electrode comprises forming the layer of metal by a liquid phase processing method.

4. The method of claim 3, wherein forming the layer of metal comprises electroplating, electroless deposition, solvent evaporation, precipitation, or cooling to a solid.

5. The method of claim 1, wherein the metal layer comprises a metal selected from the group consisting of Ti, Ta, Al, In, Nb, Hf, Sn, Zn, Zr, Cu, and Y.

6. The method of claim 1, wherein the inorganic insulator or broad band semiconductor comprises a metal oxide material selected from a group consisting of Ti$_x$O$_y$, Ta$_x$O$_y$, Al$_x$O$_y$, In$_x$O$_y$, Nb$_x$O$_y$, Hf$_x$O$_y$, Sn$_x$O$_y$, Zn$_x$O$_y$, Zr$_x$O$_y$, Cu$_x$O$_y$, Y$_x$O$_y$, Y$_x$Ba$_y$O$_z$, and Sm$_x$Sn$_y$O$_z$.

7. The method of claim 1, wherein the inorganic insulating or broad band semiconducting material comprises an inorganic ceramic nanocomposite.

8. The method of claim 1, wherein forming the layer of the inorganic insulator or broad band semiconductor comprises anodizing at least a portion of the metal layer.

9. The method of claim 1, wherein forming the layer of the inorganic insulator or broad band semiconductor comprises treating the layer of metal with an oxygen-containing plasma or chemically treating the first conductive layer.

10. The method of claim 1 further comprising annealing the layer of the inorganic insulator or broad band semiconductor.

11. The method of claim 1, wherein the layer of inorganic insulator or broad band semiconductor has a thickness of about 30-500 nm.

12. The method of claim 1, wherein forming the layer of second conductive material comprises:
  contacting an underlying layer with a liquid selected from a group consisting of a solution, a suspension, a melt or a sol-gel, wherein the liquid comprises the second conductive material or a precursor thereof; and
  depositing the second conductive material from said solution, suspension, melt or sol-gel to form the layer of the second conductive material.

13. The method of claim 12, wherein depositing the second conductive material comprises at least one of evaporating a solvent from a liquid containing the second conductive material or a precursor thereof; cooling the liquid; heating the liquid; irradiating the liquid; chemically treating the precursor in the liquid, or electrochemically treating the precursor in the liquid.

14. The method of claim 12 or 13, wherein the liquid comprises a surfactant.

15. The method of claim 1, wherein the liquid-phase processing method is selected from a group consisting of spin-coating, spray-coating, bar-coating, dip-coating, slot-coating, electroless plating, electroplating, and sol-gel deposition.

16. The method of claim 1, wherein forming the layer of second conductive material comprises printing.

17. The method of claim 16, wherein printing comprises at least one of ink-jet printing, offset printing, silk-screen printing or thermal transfer printing.

18. The method of claim 1, wherein the second conductive material is selected from the group consisting of a polymer, a conjugated polymer and an oligomer.

19. The method of claim 1, wherein the second conductive material comprises one or more conductive polymers selected from the group consisting of polythiophenes, polypyrroles, polyanilines, and copolymers thereof, wherein each of the conductive polymers is substituted or unsubstituted.

20. The method of claim 19, wherein the second conductive material comprises poly(3,4-ethylenedioxythiophene) (PEDOT) doped with poly(4-styrene sulphonate) (PSS), or dimethyl sulfoxide (DMSO).

21. The method of claim 1, wherein the second conductive material comprises a dopant.

22. The method of claim 1, wherein the second conductive material is soluble in a solvent during fabrication process.

23. The method of claim 22, wherein the solvent is a polar solvent.

24. The method of claim 1, wherein the layer of second conductive material comprises essentially neutral polymers selected from the group consisting of essentially neutral polyfluorenes, polyphenylenes, polythiophenes and derivatives thereof.

25. The method of claim 1, wherein the second conductive material includes a conductive material selected from the group consisting of fullerenes, carbon nano-tubes, graphite nano-particles and derivatives thereof.

26. The method of claim 1, wherein the second conductive material comprises an inorganic or organometallic conductive material.

27. The method of claim 26, wherein the second conductive material comprises a material selected from a group consisting of metals, conductive metal oxides, conductive forms of carbon, conductive composite materials, and conductive metal complexes.

28. The method of claim 27, wherein the second conductive material is selected from a group consisting of Ag, Au, Ni, indium tin oxide (ITO), indium zinc oxide (IZO) and aluminum zinc oxide (AZO)

29. The method of claim 26, wherein the second conducting material comprises a dopant selected from a group consisting of salts providing cations with +1, +2 and +3 charges.

30. The method of claim 1, further comprising forming a layer of organic semiconductor material, wherein said layer resides between the layer of metal and the layer of second conductive material.

31. The method of claim 30, wherein the layer of organic semiconductor material comprises at least one of poly(2-methoxy,5-(2'-ethylhexyloxy)-1,4-phenylene vinylene) (MEH-PPV),poly(3-hexylthiophene)($P_3$HT),polyfluorene (PF),2-(4-biphenyl)-5-(4-tert-butylphenyl)-1,3,4-oxadiazole (PBD),4,4'-bis[N-(1-naphthyl)-7V-phenylamino]biphenyl (NPB), and 4,4'-bis[N-(3-methylphenyl)-N-phenylamino] biphenyl (TPB) or derivatives thereof.

32. The method of claim 1, wherein the work function difference between the first work function value and the second work function value is less than about 100meV, and the switching device has a symmetrical current-voltage characteristic.

33. The method of claim 1, wherein the work function difference between the first work function value and the second work function value is at least about 100 meV, and the switching device has an asymmetrical current-voltage characteristic.

34. A method of forming a display, comprising:
  forming a plurality of pixel control circuits on a substrate, wherein each pixel control circuit comprises at least one vertical two-terminal switching device being configured to regulate light from a pixel;
  wherein forming at least one vertical two-terminal switching device comprises
    forming a first electrode of the two-terminal switching device, wherein the first electrode comprises a layer of metal being characterized by a first work function value;
    forming a layer of an inorganic insulator or broad band semiconductor over at least a portion of the first electrode, wherein forming the layer of the inorganic insulator or broad band semiconductor comprises anodizing, thermally oxidizing or plasma oxidizing at least a portion of the metal layer; and
    forming a second electrode, said forming the second electrode comprising forming a layer of a second conductive material overlaying at least a portion of the layer of an inorganic insulator or broad band semiconductor and residing over at least a portion of the first electrode, by a liquid-phase processing method, wherein the conductive material is characterized by a second work function value.

35. The method of claim 34, wherein the switching device has a symmetrical current-voltage characteristic and wherein the display is a liquid crystal display.

36. The method of claim 34, wherein the switching device has an asymmetrical current-voltage characteristic and wherein the display is an electrophoretic display or a rotating element display.

37. The method of claim 1, wherein the layer of second conductive material has a thickness of at least 100 Angstroms.

38. The method of claim 1, wherein the layer of second conductive material has a thickness of at least 100 microns.

39. The method of claim 1, wherein forming the layer of broad band semiconductor comprises anodizing tantalum or titanium.

40. The method of claim 1, wherein the layer of broad band semiconductor or insulator is formed by anodizing the metal layer in a solution comprising a non-acid electrolyte.

41. The method of claim 1, wherein the layer of broad band semiconductor or insulator is formed by anodizing the metal layer in a solution comprising a salt selected from the group consisting of tartate, a citrate, and a phosphate.

42. The method of claim 1 further comprising depositing a semiconductor layer after (b) and before (c).

43. The method of claim 42, wherein the semiconductor layer comprises a material selected from the group consisting of MEH-PPV, $P_3HT$, PF, PBD, NPB, and TPB or derivatives thereof.

44. The method of claim 1, wherein the layer of insulator or broad band semiconductor comprises metal oxide, wherein the method further comprises forming an interface-modifying layer over the metal oxide, wherein the interface-modifying layer comprises an organosilicon material having fluorine-substituted alkyl groups.

* * * * *